United States Patent
Kim et al.

(10) Patent No.: US 7,989,933 B1
(45) Date of Patent: Aug. 2, 2011

(54) INCREASED I/O LEADFRAME AND SEMICONDUCTOR DEVICE INCLUDING SAME

(75) Inventors: Gi Jeong Kim, Guri-si (KR); Yeon Ho Choi, Chandler, AZ (US); Wan Jong Kim, Goyang-si (KR)

(73) Assignee: Amkor Technology, Inc., Chandler, AZ (US)

( * ) Notice: Subject to any disclaimer, the term of this patent is extended or adjusted under 35 U.S.C. 154(b) by 286 days.

(21) Appl. No.: 12/246,226

(22) Filed: Oct. 6, 2008

(51) Int. Cl.
*H01L 23/495* (2006.01)

(52) U.S. Cl. ...................................... 257/676; 257/692

(58) Field of Classification Search .......... 257/666–677, 257/692–696, E23.011, E23.031
See application file for complete search history.

(56) References Cited

U.S. PATENT DOCUMENTS

| | | | |
|---|---|---|---|
| 2,596,993 | A | 5/1952 | Gookin |
| 3,435,815 | A | 4/1969 | Forcier |
| 3,734,660 | A | 5/1973 | Davies et al. |
| 3,838,984 | A | 10/1974 | Crane et al. |
| 4,054,238 | A | 10/1977 | Lloyd et al. |
| 4,189,342 | A | 2/1980 | Kock |
| 4,221,925 | A | 9/1980 | Finley et al. |
| 4,258,381 | A | 3/1981 | Inaba |
| 4,289,922 | A | 9/1981 | Devlin |
| 4,301,464 | A | 11/1981 | Otsuki et al. |
| 4,332,537 | A | 6/1982 | Slepcevic |
| 4,417,266 | A | 11/1983 | Grabbe |
| 4,451,224 | A | 5/1984 | Harding |
| 4,530,152 | A | 7/1985 | Roche et al. |
| 4,541,003 | A | 9/1985 | Otsuka et al. |
| 4,646,710 | A | 3/1987 | Schmid et al. |
| 4,707,724 | A | 11/1987 | Suzuki et al. |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Leonardo Andújar
*Assistant Examiner* — Jordan Klein
(74) *Attorney, Agent, or Firm* — Stetina Brunda Garred & Brucker

(57) ABSTRACT

In accordance with the present invention, there is provided a semiconductor package (e.g., a QFP package) including a uniquely configured leadframe sized and configured to maximize the available number of exposed leads in the semiconductor package. More particularly, the semiconductor package of the present invention includes a generally planar die pad or die paddle defining multiple peripheral edge segments. In addition, the semiconductor package includes a plurality of leads. Some of these leads include exposed bottom surface portions which are provided in at least two concentric rows or rings which at least partially circumvent the die pad, with other leads including portions which protrude from respective side surfaces of a package body of the semiconductor package. Connected to the top surface of the die pad is at least one semiconductor die which is electrically connected to at least some of the leads. At least portions of the die pad, the leads, and the semiconductor die are encapsulated by the package body, with at least portions of the bottom surfaces of the die paddle and some of the leads being exposed in a common exterior surface of the package body.

20 Claims, 22 Drawing Sheets

U.S. PATENT DOCUMENTS

| | | | |
|---|---|---|---|
| 4,727,633 A | 3/1988 | Herrick | |
| 4,737,839 A | 4/1988 | Burt | |
| 4,756,080 A | 7/1988 | Thorpe, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |
| 4,920,074 A | 4/1990 | Shimizu et al. | |
| 4,935,803 A | 6/1990 | Kalfus et al. | |
| 4,942,454 A | 7/1990 | Mori et al. | |
| 4,987,475 A | 1/1991 | Sclesinger et al. | |
| 5,018,003 A | 5/1991 | Yasunaga et al. | |
| 5,029,386 A | 7/1991 | Chao et al. | |
| 5,041,902 A | 8/1991 | McShane | |
| 5,057,900 A | 10/1991 | Yamazaki | |
| 5,059,379 A | 10/1991 | Tsutsumi et al. | |
| 5,065,223 A | 11/1991 | Matsuki et al. | |
| 5,070,039 A | 12/1991 | Johnson et al. | |
| 5,087,961 A | 2/1992 | Long et al. | |
| 5,091,341 A | 2/1992 | Asada et al. | |
| 5,096,852 A | 3/1992 | Hobson et al. | |
| 5,118,298 A | 6/1992 | Murphy | |
| 5,122,860 A | 6/1992 | Kichuchi et al. | |
| 5,134,773 A | 8/1992 | LeMaire et al. | |
| 5,151,039 A | 9/1992 | Murphy | |
| 5,157,475 A | 10/1992 | Yamaguchi | |
| 5,157,480 A | 10/1992 | McShane et al. | |
| 5,168,368 A | 12/1992 | Gow, 3rd et al. | |
| 5,172,213 A | 12/1992 | Zimmerman | |
| 5,172,214 A | 12/1992 | Casto | |
| 5,175,060 A | 12/1992 | Enomoto et al. | |
| 5,200,362 A | 4/1993 | Lin et al. | |
| 5,200,809 A | 4/1993 | Kwon | |
| 5,202,577 A * | 4/1993 | Ichigi et al. | 257/667 |
| 5,214,845 A | 6/1993 | King et al. | |
| 5,216,278 A | 6/1993 | Lin et al. | |
| 5,218,231 A | 6/1993 | Kudo | |
| 5,221,642 A | 6/1993 | Burns | |
| 5,250,841 A | 10/1993 | Sloan et al. | |
| 5,252,853 A | 10/1993 | Michii | |
| 5,258,094 A | 11/1993 | Furui et al. | |
| 5,266,834 A | 11/1993 | Nishi et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,279,029 A | 1/1994 | Burns | |
| 5,281,849 A | 1/1994 | Singh Deo et al. | |
| 5,285,352 A | 2/1994 | Pastore et al. | |
| 5,294,897 A | 3/1994 | Notani et al. | |
| 5,327,008 A | 7/1994 | Djennas et al. | |
| 5,332,864 A | 7/1994 | Liang et al. | |
| 5,335,771 A | 8/1994 | Murphy | |
| 5,336,931 A | 8/1994 | Juskey et al. | |
| 5,343,076 A | 8/1994 | Katayama et al. | |
| 5,358,905 A | 10/1994 | Chiu | |
| 5,365,106 A | 11/1994 | Watanabe | |
| 5,381,042 A | 1/1995 | Lerner et al. | |
| 5,391,439 A | 2/1995 | Tomita et al. | |
| 5,406,124 A | 4/1995 | Morita et al. | |
| 5,410,180 A | 4/1995 | Fujii et al. | |
| 5,414,299 A | 5/1995 | Wang et al. | |
| 5,417,905 A | 5/1995 | LeMaire et al. | |
| 5,424,576 A | 6/1995 | Djennas et al. | |
| 5,428,248 A | 6/1995 | Cha | |
| 5,434,057 A | 7/1995 | Bindra et al. | |
| 5,444,301 A | 8/1995 | Song et al. | |
| 5,451,715 A * | 9/1995 | Hundt et al. | 174/524 |
| 5,452,511 A | 9/1995 | Chang | |
| 5,454,905 A | 10/1995 | Fogelson | |
| 5,467,032 A | 11/1995 | Lee | |
| 5,474,958 A | 12/1995 | Djennas et al. | |
| 5,484,274 A | 1/1996 | Neu | |
| 5,493,151 A | 2/1996 | Asada et al. | |
| 5,508,556 A | 4/1996 | Lin | |
| 5,517,056 A | 5/1996 | Bigler et al. | |
| 5,521,429 A | 5/1996 | Aono et al. | |
| 5,528,076 A | 6/1996 | Pavio | |
| 5,534,467 A | 7/1996 | Rostoker | |
| 5,539,251 A | 7/1996 | Iverson et al. | |
| 5,543,657 A | 8/1996 | Diffenderfer et al. | |
| 5,544,412 A | 8/1996 | Romero et al. | |
| 5,545,923 A | 8/1996 | Barber | |
| 5,581,122 A | 12/1996 | Chao et al. | |
| 5,592,019 A | 1/1997 | Ueda et al. | |
| 5,592,025 A | 1/1997 | Clark et al. | |
| 5,594,274 A | 1/1997 | Suetaki | |
| 5,595,934 A | 1/1997 | Kim | |
| 5,604,376 A | 2/1997 | Hamburgen et al. | |
| 5,608,265 A | 3/1997 | Kitano et al. | |
| 5,608,267 A | 3/1997 | Mahulikar et al. | |
| 5,625,222 A | 4/1997 | Yoneda et al. | |
| 5,633,528 A | 5/1997 | Abbott et al. | |
| 5,637,922 A | 6/1997 | Fillion et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,643,433 A | 7/1997 | Fukase et al. | |
| 5,644,169 A | 7/1997 | Chun | |
| 5,646,831 A | 7/1997 | Manteghi | |
| 5,650,663 A | 7/1997 | Parthasarathi | |
| 5,661,088 A | 8/1997 | Tessier et al. | |
| 5,665,996 A | 9/1997 | Williams et al. | |
| 5,673,479 A | 10/1997 | Hawthorne | |
| 5,683,806 A | 11/1997 | Sakumoto et al. | |
| 5,683,943 A | 11/1997 | Yamada | |
| 5,689,135 A | 11/1997 | Ball | |
| 5,696,666 A | 12/1997 | Miles et al. | |
| 5,701,034 A | 12/1997 | Marrs | |
| 5,703,407 A | 12/1997 | Hori | |
| 5,710,064 A | 1/1998 | Song et al. | |
| 5,723,899 A | 3/1998 | Shin | |
| 5,724,233 A | 3/1998 | Honda et al. | |
| 5,726,493 A | 3/1998 | Yamashita | |
| 5,736,432 A | 4/1998 | Mackessy | |
| 5,745,984 A | 5/1998 | Cole, Jr. et al. | |
| 5,753,532 A | 5/1998 | Sim | |
| 5,753,977 A | 5/1998 | Kusaka et al. | |
| 5,766,972 A | 6/1998 | Takahashi et al. | |
| 5,767,566 A | 6/1998 | Suda | |
| 5,770,888 A | 6/1998 | Song et al. | |
| 5,776,798 A | 7/1998 | Quan et al. | |
| 5,783,861 A | 7/1998 | Son | |
| 5,801,440 A | 9/1998 | Chu et al. | |
| 5,814,877 A | 9/1998 | Diffenderfer et al. | |
| 5,814,881 A | 9/1998 | Alagaratnam et al. | |
| 5,814,883 A | 9/1998 | Sawai et al. | |
| 5,814,884 A | 9/1998 | Davies et al. | |
| 5,817,540 A | 10/1998 | Wark | |
| 5,818,105 A | 10/1998 | Kouda | |
| 5,821,457 A | 10/1998 | Mosley et al. | |
| 5,821,615 A | 10/1998 | Lee | |
| 5,834,830 A | 11/1998 | Cho | |
| 5,835,988 A | 11/1998 | Ishii | |
| 5,844,306 A | 12/1998 | Fujita et al. | |
| 5,854,511 A | 12/1998 | Shin et al. | |
| 5,854,512 A | 12/1998 | Manteghi | |
| 5,856,911 A | 1/1999 | Riley | |
| 5,859,471 A | 1/1999 | Kuraishi et al. | |
| 5,866,939 A | 2/1999 | Shin et al. | |
| 5,866,942 A | 2/1999 | Suzuki et al. | |
| 5,871,782 A | 2/1999 | Choi | |
| 5,874,784 A | 2/1999 | Aoki et al. | |
| 5,877,043 A | 3/1999 | Alcoe et al. | |
| 5,877,542 A * | 3/1999 | Ohuchi | 257/667 |
| 5,886,397 A | 3/1999 | Ewer | |
| 5,973,935 A | 10/1999 | Schoenfeld et al. | |
| 5,977,630 A | 11/1999 | Woodworth et al. | |
| RE36,773 E | 7/2000 | Nomi et al. | |
| 6,087,718 A * | 7/2000 | Cho | 257/686 |
| 6,107,679 A | 8/2000 | Noguchi | |
| 6,143,981 A | 11/2000 | Glenn | |
| 6,150,709 A * | 11/2000 | Shin et al. | 257/666 |
| 6,157,074 A | 12/2000 | Lee | |
| 6,166,430 A | 12/2000 | Yamaguchi | |
| 6,169,329 B1 | 1/2001 | Farnworth et al. | |
| 6,177,718 B1 | 1/2001 | Kozono | |
| 6,181,002 B1 | 1/2001 | Juso et al. | |

| | | |
|---|---|---|
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | McClellan et al. |
| 6,229,205 B1 | 5/2001 | Jeong et al. |
| 6,238,952 B1 | 5/2001 | Lin et al. |
| 6,239,367 B1 | 5/2001 | Hsuan et al. |
| 6,239,384 B1 | 5/2001 | Smith et al. |
| 6,242,281 B1 | 6/2001 | McClellan et al. |
| 6,256,200 B1 | 7/2001 | Lam et al. |
| 6,258,629 B1 | 7/2001 | Niones et al. |
| 6,261,864 B1 | 7/2001 | Jung et al. |
| 6,281,566 B1 | 8/2001 | Magni |
| 6,282,094 B1 | 8/2001 | Lo et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,306,685 B1 | 10/2001 | Liu et al. |
| 6,307,272 B1 | 10/2001 | Takahashi et al. |
| 6,309,909 B1 | 10/2001 | Ohgiyama |
| 6,316,822 B1 | 11/2001 | Vekateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karmezos et al. |
| 6,335,564 B1 | 1/2002 | Pour |
| 6,337,510 B1 | 1/2002 | Chun-Jen et al. |
| 6,339,252 B1 | 1/2002 | Niones et al. |
| 6,339,255 B1 | 1/2002 | Shin |
| 6,342,730 B1 | 1/2002 | Jung et al. |
| 6,348,726 B1 | 2/2002 | Bayan et al. |
| 6,355,502 B1 | 3/2002 | Kang et al. |
| 6,359,221 B1 | 3/2002 | Yamada et al. |
| 6,362,525 B1 | 3/2002 | Rahim |
| 6,369,447 B2 | 4/2002 | Mori |
| 6,369,454 B1 | 4/2002 | Chung |
| 6,373,127 B1 | 4/2002 | Baudouin et al. |
| 6,377,464 B1 | 4/2002 | Hashemi et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,399,415 B1 | 6/2002 | Bayan et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,421,013 B1 | 7/2002 | Chung |
| 6,423,643 B1 | 7/2002 | Furuhata et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijinders |
| 6,465,883 B2 | 10/2002 | Oloffson |
| 6,472,735 B2 | 10/2002 | Isaak |
| 6,475,646 B2 | 11/2002 | Park et al. |
| 6,476,469 B2 | 11/2002 | Hung et al. |
| 6,476,474 B1 | 11/2002 | Hung |
| 6,482,680 B1 | 11/2002 | Khor et al. |
| 6,483,178 B1 | 11/2002 | Chuang |
| 6,492,718 B2 | 12/2002 | Ohmori et al. |
| 6,495,909 B2 | 12/2002 | Jung et al. |
| 6,498,099 B1 | 12/2002 | McClellan et al. |
| 6,498,392 B2 | 12/2002 | Azuma |
| 6,507,096 B2 | 1/2003 | Gang |
| 6,507,120 B2 | 1/2003 | Lo et al. |
| 6,518,089 B2 | 2/2003 | Coyle |
| 6,525,942 B2 | 2/2003 | Huang et al. |
| 6,528,893 B2 | 3/2003 | Jung et al. |
| 6,534,849 B1 | 3/2003 | Gang |
| 6,545,332 B2 | 4/2003 | Huang |
| 6,545,345 B1 | 4/2003 | Glenn et al. |
| 6,552,421 B2 | 4/2003 | Kishimoto et al. |
| 6,559,525 B2 | 5/2003 | Huang |
| 6,566,168 B2 | 5/2003 | Gang |
| 6,580,161 B2 | 6/2003 | Kobayakawa |
| 6,583,503 B2 | 6/2003 | Akram et al. |
| 6,585,905 B1 | 7/2003 | Fan et al. |
| 6,603,196 B2 | 8/2003 | Lee et al. |
| 6,624,005 B1 | 9/2003 | DiCaprio et al. |
| 6,627,977 B1 * | 9/2003 | Foster ............................ 257/666 |
| 6,646,339 B1 | 11/2003 | Ku |
| 6,667,546 B2 | 12/2003 | Huang et al. |
| 6,677,663 B1 | 1/2004 | Ku et al. |
| 6,686,649 B1 | 2/2004 | Matthews et al. |
| 6,696,752 B2 | 2/2004 | Su et al. |
| 6,700,189 B2 | 3/2004 | Shibata |
| 6,713,375 B2 | 3/2004 | Shenoy |
| 6,744,121 B2 * | 6/2004 | Chang et al. ................... 257/668 |
| 6,757,178 B2 | 6/2004 | Okabe et al. |
| 6,800,936 B2 | 10/2004 | Kosemura et al. |
| 6,812,552 B2 | 11/2004 | Islam et al. |
| 6,818,973 B1 | 11/2004 | Foster |
| 6,858,919 B2 | 2/2005 | Seo et al. |
| 6,867,492 B2 | 3/2005 | Auburger et al. |
| 6,876,068 B1 | 4/2005 | Lee et al. |
| 6,878,571 B2 | 4/2005 | Isaak et al. |
| 6,897,552 B2 | 5/2005 | Nakao |
| 6,927,478 B2 | 8/2005 | Paek |
| 6,967,125 B2 | 11/2005 | Fee et al. |
| 6,995,459 B2 * | 2/2006 | Lee et al. ....................... 257/676 |
| 7,002,805 B2 | 2/2006 | Lee et al. |
| 7,005,327 B2 | 2/2006 | Kung et al. |
| 7,015,571 B2 | 3/2006 | Chang et al. |
| 7,045,396 B2 | 5/2006 | Crowley et al. |
| 7,053,469 B2 | 5/2006 | Koh et al. |
| 7,075,816 B2 | 7/2006 | Fee et al. |
| 7,087,462 B1 * | 8/2006 | Park et al. ...................... 257/666 |
| 7,102,209 B1 | 9/2006 | Bayan et al. |
| 7,109,572 B2 | 9/2006 | Fee et al. |
| 7,170,150 B2 * | 1/2007 | Lee ................................ 257/666 |
| 7,185,426 B1 | 3/2007 | Hiner |
| 7,193,298 B2 * | 3/2007 | Hong et al. .................... 257/666 |
| 7,211,471 B1 | 5/2007 | Foster |
| 7,245,007 B1 | 7/2007 | Foster |
| 7,253,503 B1 | 8/2007 | Fusaro et al. |
| 7,687,892 B2 * | 3/2010 | Espiritu et al. ................ 257/672 |
| 2001/0008305 A1 | 7/2001 | McClellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0038873 A1 | 4/2002 | Hiyoshi |
| 2002/0072147 A1 | 6/2002 | Sayanagi et al. |
| 2002/0111009 A1 | 8/2002 | Huang et al. |
| 2002/0140061 A1 | 10/2002 | Lee |
| 2002/0140068 A1 | 10/2002 | Lee et al. |
| 2002/0140081 A1 | 10/2002 | Chou et al. |
| 2002/0158318 A1 | 10/2002 | Chen |
| 2002/0163015 A1 | 11/2002 | Lee et al. |
| 2002/0167060 A1 | 11/2002 | Buijsman et al. |
| 2003/0006055 A1 | 1/2003 | Chien-Hung et al. |
| 2003/0030131 A1 | 2/2003 | Lee et al. |
| 2003/0059644 A1 | 3/2003 | Datta et al. |

| | | | | | | |
|---|---|---|---|---|---|---|
| 2003/0064548 A1 | 4/2003 | Isaak | | JP | 2129948 | 5/1990 |
| 2003/0073265 A1* | 4/2003 | Hu et al. ............... 257/666 | | JP | 369248 | 7/1991 |
| 2003/0102537 A1 | 6/2003 | McLellan et al. | | JP | 3177060 | 8/1991 |
| 2003/0164554 A1 | 9/2003 | Fee et al. | | JP | 3289162 | 12/1991 |
| 2003/0168719 A1 | 9/2003 | Cheng et al. | | JP | 4098864 | 3/1992 |
| 2003/0198032 A1 | 10/2003 | Collander et al. | | JP | 5129473 | 5/1993 |
| 2004/0027788 A1 | 2/2004 | Chiu et al. | | JP | 5166992 | 7/1993 |
| 2004/0056277 A1 | 3/2004 | Karnezos | | JP | 5283460 | 10/1993 |
| 2004/0061212 A1 | 4/2004 | Karnezos | | JP | 6061401 | 3/1994 |
| 2004/0061213 A1 | 4/2004 | Karnezos | | JP | 692076 | 4/1994 |
| 2004/0063242 A1 | 4/2004 | Karnezos | | JP | 6140563 | 5/1994 |
| 2004/0063246 A1 | 4/2004 | Karnezos | | JP | 652333 | 9/1994 |
| 2004/0065963 A1 | 4/2004 | Karnezos | | JP | 6252333 | 9/1994 |
| 2004/0080025 A1 | 4/2004 | Kasahara et al. | | JP | 6260532 | 9/1994 |
| 2004/0089926 A1 | 5/2004 | Hsu et al. | | JP | 7297344 | 11/1995 |
| 2004/0097016 A1* | 5/2004 | Yee et al. ............... 257/676 | | JP | 7312405 | 11/1995 |
| 2004/0164387 A1 | 8/2004 | Ikenaga et al. | | JP | 8064364 | 3/1996 |
| 2004/0253803 A1 | 12/2004 | Tomono et al. | | JP | 8083877 | 3/1996 |
| 2005/0199987 A1 | 9/2005 | Danno et al. | | JP | 8125066 | 5/1996 |
| 2006/0033184 A1* | 2/2006 | Park et al. ............... 257/666 | | JP | 964284 | 6/1996 |
| 2006/0087020 A1 | 4/2006 | Hirano et al. | | JP | 8222682 | 8/1996 |
| 2006/0157843 A1 | 7/2006 | Hwang | | JP | 8306853 | 11/1996 |
| 2006/0231939 A1 | 10/2006 | Kawabata et al. | | JP | 98205 | 1/1997 |
| 2007/0023202 A1 | 2/2007 | Shibata | | JP | 98206 | 1/1997 |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55162252 A * | 12/1980 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000150765 | 5/2000 |
| JP | 20010600648 | 3/2001 |
| JP | 2002519848 | 7/2002 |
| JP | 200203497 | 8/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 20020049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

INCREASED I/O LEADFRAME AND SEMICONDUCTOR DEVICE INCLUDING SAME

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit package technology and, more particularly, to an increased capacity QFP semiconductor package which includes exposed leads and an exposed die pad on the bottom surface of the package body thereof, and additional leads which protrude from side surfaces of the package body.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die pad of the leadframe also remains exposed within the package body.

Leadframes for semiconductor packages can be largely classified into copper-based leadframes (copper/iron/phosphorous; 99.8/0.01/0.025), copper alloy-based leadframes (copper/chromium/tin/zinc; 99.0/0.25/0.22), alloy 42-based leadframes (iron/nickel; 58.0/42.0), etc. according to the composition of the elements or materials included in the leadframe. Exemplary semiconductor packages or devices employing leadframes include a through-hole mounting dual type inline package (DIP), a surface mounting type quad flat package (QFP), and a small outline package (SOP).

As indicated above, one type of semiconductor package commonly including a leadframe is a quad flat pack (QFP) package. QFP semiconductor packages or devices are particularly advantageous for their smaller size and superior electrical performance. A typical QFP package comprises a thin, generally square package body defining four peripheral sides of substantially equal length. Protruding from each of the four peripheral sides of the package body are a plurality of leads which each have a generally gull-wing configuration. Portions of the leads are internal to the package body, and are electrically connected to respective ones of the pads or terminals of a semiconductor die also encapsulated within the package body. The semiconductor die is itself mounted to a die pad of the QFP package leadframe. In certain types of QFP packages referred to as QFP exposed pad packages, one surface of the die pad is exposed within the bottom surface of the package body.

In the electronics industry and, in particular, in high frequency applications such hard disk drives, digital television and other consumer electronics, there is an increasing need for QFP exposed pad packages of increased functional capacity, coupled with reduced size. One of the deficiencies of currently known QFP packages is attributable to the length at which the leads protrude from the sides of the package body, such protrusion length resulting in an increase in the overall size of the QFP package and further limiting the number of inputs/outputs (I/O's) which may be included therein. With recent trends toward high integration and high performance semiconductor dies, there is a need for QFP packages to have a larger number of I/O's with excellent thermal and electrical properties. In view of this need, conventional leadframe structures as currently known and integrated into existing QFP packages often prove to be unsatisfactory.

In an attempt to address some of the deficiencies highlighted above in relation to QFP packages, there has been developed in the prior art ball grid array (BGA) and pin grid array (PGA) semiconductor packages or devices which employ the use of laminate, tape, or film circuit boards as opposed to leadframes. These particular types of semiconductor packages provide a relatively large number of I/O's, such I/O's being defined by solder balls or metal pins which are formed on a lower surface of the encapsulant or package body of the package, rather than on the side surfaces of the package body. However, the circuit boards integrated into these types of semiconductor packages are expensive and typically exhibit poor heat sink and electrical performance characteristics in comparison to semiconductor packages employing leadframes. In this regard, semiconductor packages or devices employing leadframes often exhibit good heat sink performance due to the semiconductor die being directly mounted on a metal (e.g., copper) die pad of the leadframe. Further, the die pad of the leadframe can be used as a ground area to improve the electrical properties of the semiconductor package. Such a structure is difficult to achieve in a semiconductor package employing a circuit board.

The present invention provides a QFP exposed pad package which addresses the aforementioned needs by providing increased I/O with a reduced overall size. The QFP package of the present invention includes exposed leads and an exposed die pad on the bottom surface of the package body thereof, and additional leads which protrude from side surfaces of the package body. The QFP package of the present invention is also provided through the use of standard, low-cost leadframe design techniques. These, as well as other features and attributes of the present invention will be discussed in more detail below.

BRIEF SUMMARY OF THE INVENTION

In accordance with the present invention, there is provided a semiconductor package (e.g., a QFP package) including a uniquely configured leadframe sized and configured to maximize the available number of exposed leads in the semiconductor package. More particularly, the semiconductor package of the present invention includes a generally planar die pad or die paddle defining multiple peripheral edge segments. In addition, the semiconductor package includes a plurality of leads. Some of these leads include exposed bottom surface portions which are provided in at least two concentric rows or rings which at least partially circumvent the die pad, with other leads including portions which protrude from respective side surfaces of a package body of the semiconductor package. Connected to the top surface of the die pad is at least one semiconductor die which is electrically connected to at least some of the leads. At least portions of the die pad, the leads, and the semiconductor die are encapsulated by the package body, with at least portions of the bottom surfaces of the die pad and some of the leads being exposed in a common exterior surface of the package body. The leadframe of the semiconductor package is fabricated in accordance with standard, low-cost forming techniques. In accordance with the present invention, sawing, punching, etching, or other material removal processes may be completed during the fabrication of the semiconductor package to effectively electrically isolate various leads from each other within the semiconductor package. The semiconductor package of the present invention may include one or more internal semiconductor dies, depending on functional requirements.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
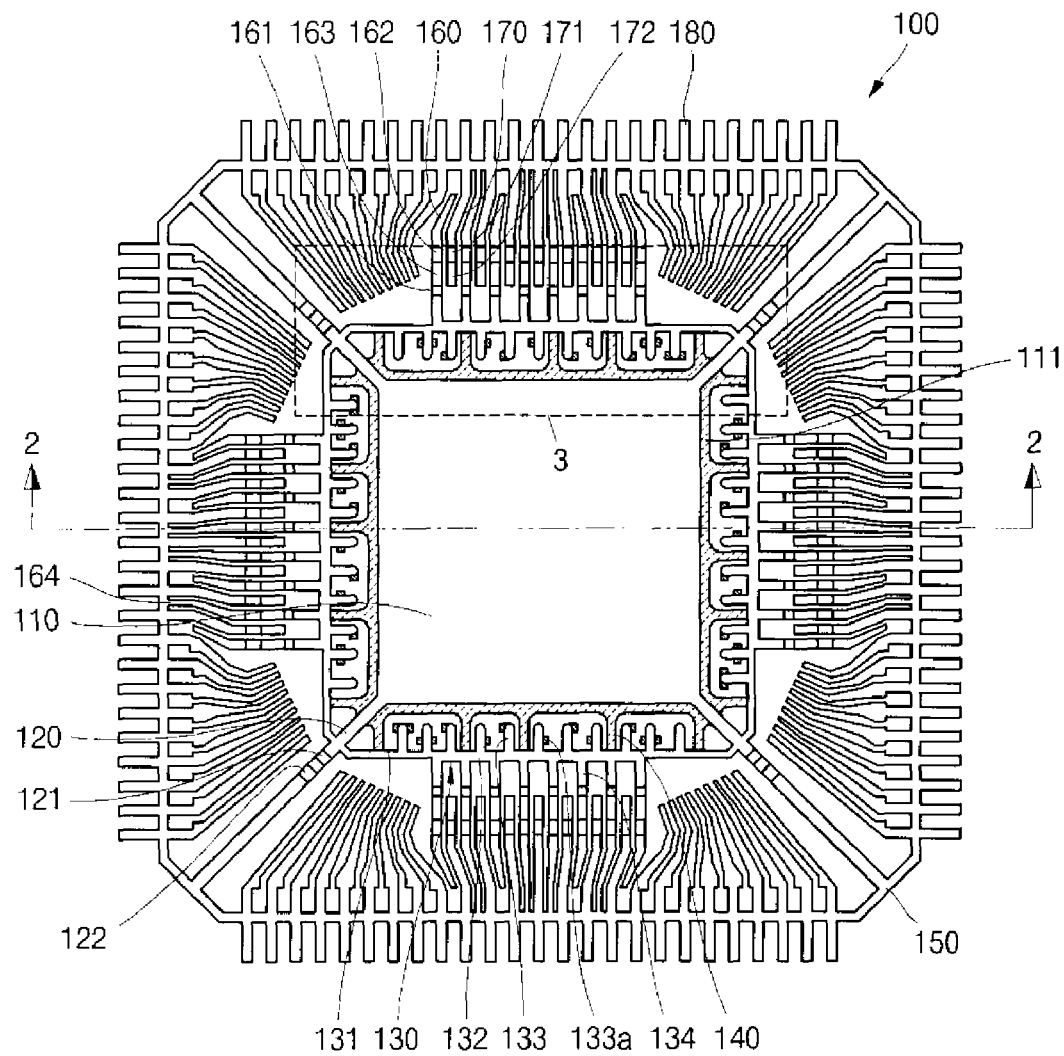
FIG. 1 is a top plan view of an unsingulated leadframe which is integrated into a semiconductor package constructed in accordance with a first embodiment of the present invention.
Figure 2:
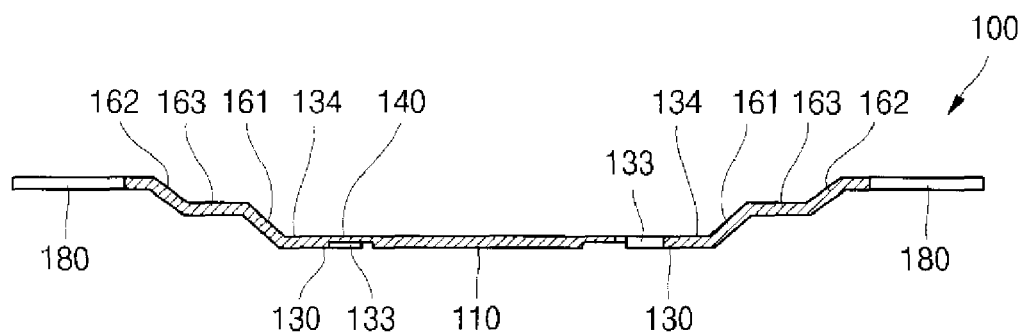
FIG. 2 is a cross-sectional view of the leadframe taken along line 2-2 of FIG. 1.
Figure 3:
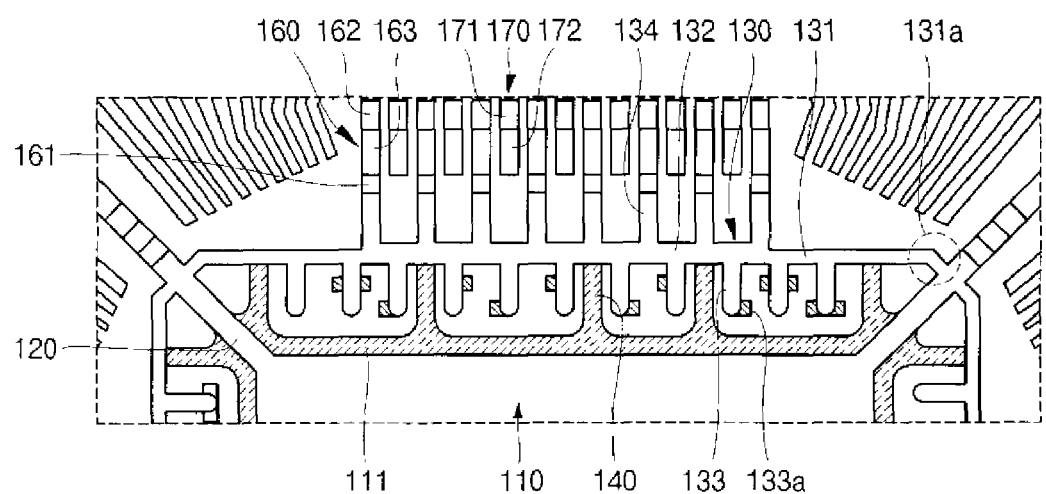
FIG. 3 is an enlargement of the region 3 included in FIG. 1.
Figure 15A:
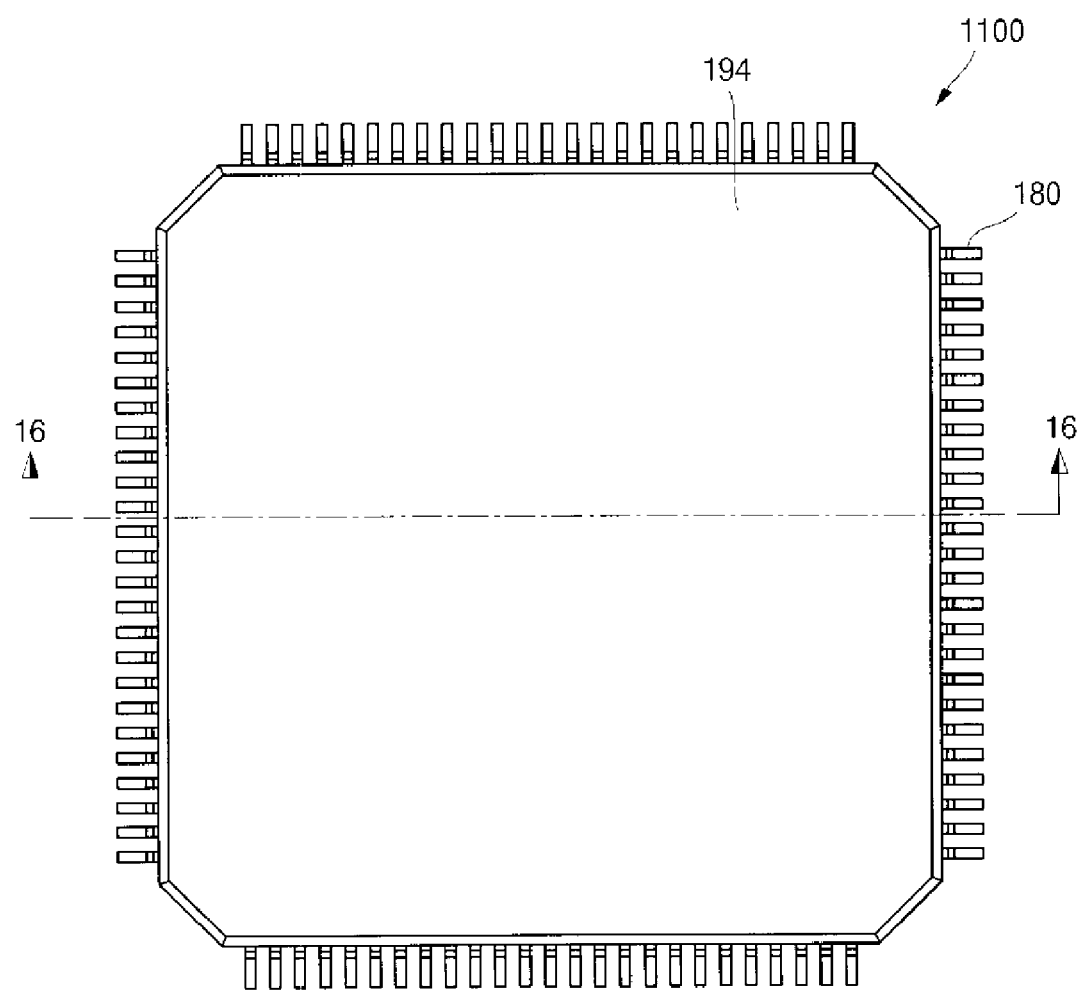
FIG. 15A is a top plan view of a semiconductor package constructed in accordance with the present invention and including the leadframe shown in FIGS. 1-3 subsequent to the singulation thereof.
Figure 15B:
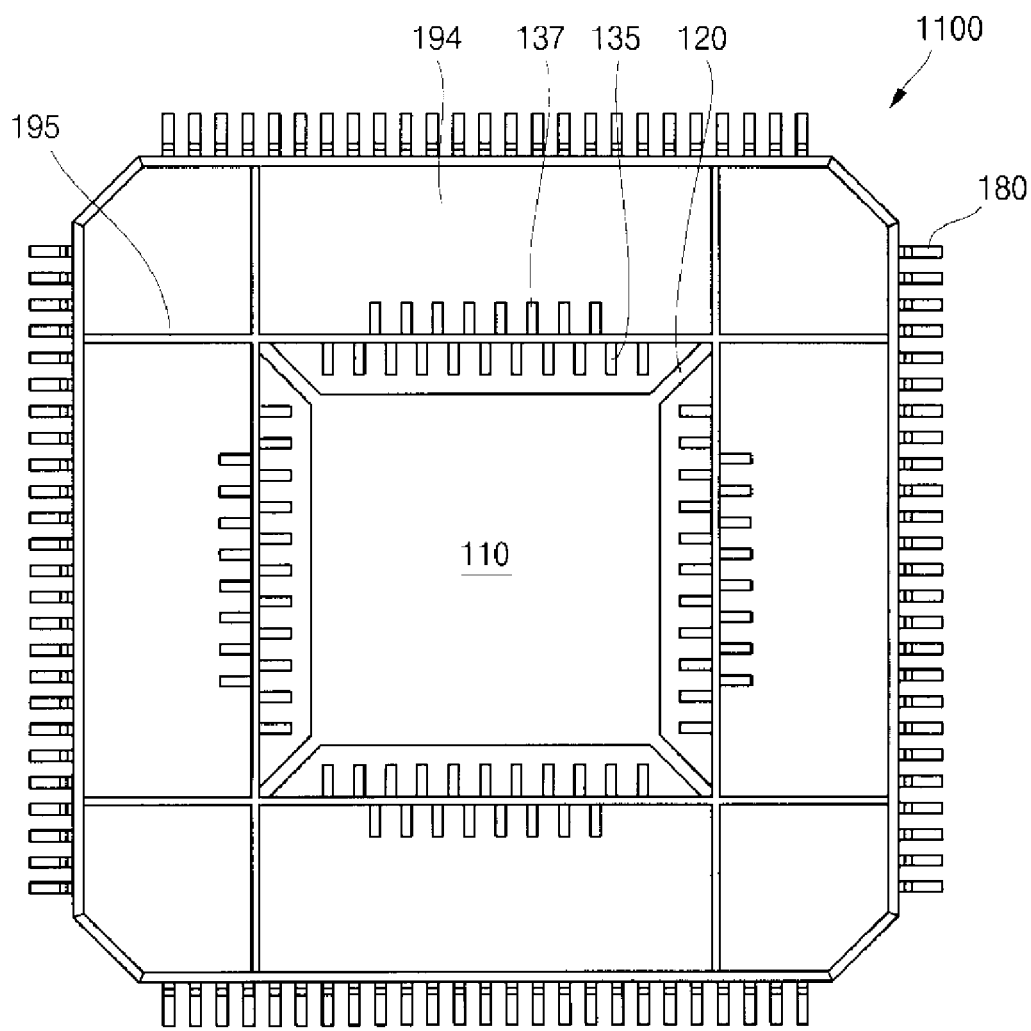
FIG. 15B is a bottom plan view of the semiconductor package shown in FIG. 15A.
Figure 16:
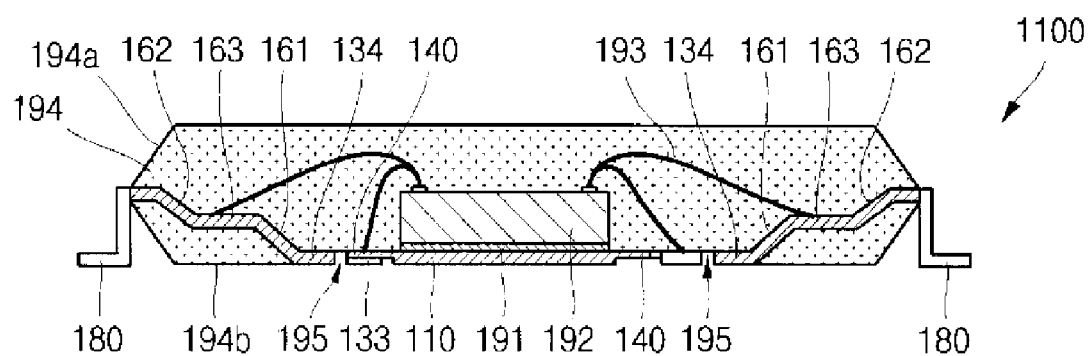
FIG. 16 is a cross-sectional view of the semiconductor package taken along line 16-16 of FIG. 15A.

Referring now to the drawings wherein the showings are for purposes of illustrating one embodiment of the present invention only, and not for purposes of limiting the same, FIGS. 1-3 depict a leadframe 100 for integration into a semiconductor package 1100 constructed in accordance with the present invention. The semiconductor package 1100 is shown in FIGS. 15A, 15B and 16.

Referring now to FIGS. 1-3, the leadframe 100 of the present invention comprises a generally quadrangular (e.g., square) die pad 110 which defines four peripheral edge segments. Integrally connected to the die pad 110 is a plurality of tie bars 120. More particularly, the leadframe 100 includes four tie bars 120 which extend diagonally from respective ones of the four corner regions defined by the die pad 110. In the leadframe 100, each of the tie bars 120 is bent to include a first downset 121 and a second downset 122. The first downset 121 of each tie bar 120 is disposed between the second downset 122 and the die pad 110. Due to the inclusion of the first and second downsets 121, 122 therein, each of the tie bars 120 includes a first segment which is disposed between the die pad 110 and the first downset 121 and extends in generally co-planar relation to the die pad 110, a second segment which extends between the first and second downsets 121, 122 and resides on a plane which is elevated above that of the die pad 110, and a third segment which extends between the second downset 122 and a dambar 150, the third segment and the dambar 150 each residing on a plane which is elevated above that of the second segment. Thus, the first, second and third segments of each tie bar 120 reside on respective ones of three spaced, generally parallel planes, with the plane upon which the second segment resides being disposed between those planes on which respective ones of the first and third segments reside.

As indicated above, the tie bars 120 are integrally connected to the dambar 150 which circumvents the die pad 110. In the leadframe 100, the dambar 150 is provided in the form of a substantially quadrangular (e.g., square) ring which interconnects the distal ends of the tie bars 120, thus resulting in the dambar 150 extending in generally co-planar relation to the third segments of the tie bars 120. As best seen in FIG. 1, the dambar 150 defines four peripheral segments which extend in spaced, generally parallel relation to respective ones of the peripheral edge segments of the die pad 110. In a fabrication process for the semiconductor package 1100 which will be described in more detail below, the dambar 150 is singulated or removed from the leadframe 100 to electrically isolate other structural features of the leadframe 100 from each other.

As seen in FIGS. 1 and 2, the die pad 110 of the leadframe 100 is not of uniform thickness. Rather, formed in a peripheral portion of the bottom surface of the die pad 110 is a half-etched portion 111. More particularly, the half-etched portion 111 is segregated into four segments, with each of these segments extending along a respective one of the peripheral edge segments of the die pad 110 and between a respective pair of the tie bars 120. The half-etched portion 111 of the die pad 110 is indicated by the hatching shown in FIG. 1. As will be discussed in more detail below, in the fabrication process for the semiconductor package 1100 including the leadframe 100, a semiconductor die is attached to the top surface of the die pad 110 through the use of an adhesive layer, with an encapsulant material thereafter being applied to the semiconductor die and the leadframe 100 to form the package body of the semiconductor package 1100. Advantageously, the half-etched portion 111 formed in the peripheral portion of the bottom surface of the die pad 110 as indicated above effectively increases the distance along which moisture must travel to reach the semiconductor die mounted to the top surface of the die pad 110. As a result, such semiconductor die is safely protected against moisture in the completed semiconductor package 1100. Additionally, the flow of encapsulant material over the half-etched portion 111 during the formation of the package body of the semiconductor package 1100 facilitates the creation of a mechanical interlock between the package body and the die pad 110.

As indicated above, each of the tie bars 120 is integrally connected to the dambar 150. In addition, each of the tie bars 120 is integrally connected to a land connecting bar 130 which, like the dambar 150, circumvents the die pad 110. In this regard, the land connecting bar 130 includes four peripheral segments which extend in spaced, generally parallel relation to respective ones of the peripheral edge segments of the die pad 110. Additionally, the land connecting bar 130 is concentrically positioned between the dambar 150 and the die pad 110, and is integrally connected to the tie bars 120 between the die pad 110 and the first downsets 121 of the tie bars 120. As is best seen in FIG. 3, each of the four peripheral segments of the land connecting bar 130 includes a spaced pair of outer portions 131 and a central portion 132 which extends between and interconnects the outer portions 131. Within each peripheral segment of the land connecting bar 130, the outer portions 131 are of identical width, with the width of the outer portions 131 being less than that of the central portion 132. More particularly, it is contemplated that in the leadframe 100, the width of the outer portions 131 of the land connecting bar 130 will be in the range of about 85% to 90% of that of the central portions 132. The reason for the differing widths of the outer and central portions 131, 132 of the land connecting bar 130 will be discussed in more detail below.

As further seen in FIG. 3, each of the outer portions 131 of the land connecting bar 130 includes a chamfer portion 131*a* which defines the junction or interface with a respective one of the tie bars 120. The chamfer portion 131*a* is formed to extend at a predetermined angle relative the remainder of the outer portion 131 upon which it is included, and further extends generally perpendicularly relative to the tie bar 120 to which it is integrally connected. The use of the chamfer portions 131*a* of the outer portions 131 of the land connecting bar 130 will also be discussed in more detail below.

The leadframe 100 of the present invention further comprises a plurality of land leads 133 which are each integrally connected to the land connecting bar 130, and protrude inwardly toward the die pad 110. More particularly, as best seen in FIGS. 1 and 3, the land leads 133 are segregated into four sets, with each set of the land leads 133 protruding inwardly from a respective one of the peripheral segments of the land connecting bar 130 toward the die pad 110. The land leads 133 of each set are arrange at a predetermined pitch and protrude perpendicularly inward at a predetermined length from a respective one of the peripheral segments of the land connecting bar 130. Within each set of the land leads 133, certain ones of such land leads 133 protrude from the central portion 132 of the corresponding peripheral segment of the land connecting bar 130, with the remaining land leads 133 of the same set extending from respective ones of each of the two outer portions 131 of the same peripheral segment. Each of the land leads has a generally planar top surface which extends in generally co-planar relation to the top surface of the die pad 110, and a generally planar bottom surface which extends in generally co-planar relation to the bottom surface of the die pad 110 and defines a land 135 as shown in FIG. 15B.

As is further seen in FIGS. 1 and 3, each of the land leads 133 may be formed to include one or more integral locking protrusions 133*a* which protrude from one or both sides thereof. Each of the locking protrusions 133*a* is preferably half-etched as indicated by the hatching shown in FIGS. 1 and 3 such that each locking protrusion 133*a* defines a generally planar top surface which extends in generally co-planar relation to the top surface of the corresponding land leads 133, and a bottom surface which is recessed relative to the bottom surface of the corresponding land lead 133. As a result, in the process of fabricating the semiconductor package 1100 as will be described in more detail below, the encapsulant material used to form the package body of the semiconductor package 1100 completely covers or encapsulates each locking protrusion 133*a* to effectively form a mechanical interlock between the land leads 133 and the package body. This mechanical interlock assists in preventing the land leads 133 from being dislodged from the package body during a subsequent sawing process involved in the fabrication of the semiconductor package 1100, as will also be described in more detail below.

The leadframe 100 further comprises a plurality of support bars 140 which are integrally connected to and extend between the die pad 110 and the land connecting bar 130. In this regard, the support bars 140 function to connect the die pad 110 to and to support the die pad 110 within the interior of the land connecting bar 130. The support bars 140 are segregated into four sets, with each set of the support bars 140 extending generally perpendicularly between a respective one of the peripheral edge segments of the die pad 110 and a corresponding peripheral segment of the land connecting bar 130. As best seen in FIG. 3, certain ones of the support bars 140 of each set are integrally connected to the central portion 132 of the corresponding peripheral segment of the land connecting bar 130, with other ones of the support bars 140 of the same set being integrally connected to respective ones of the outer portions 131 of the same peripheral segment of the land connecting bar 130. As also seen in FIG. 3, certain ones of the support bars 140 extend between an adjacent pair of the land leads 133, with certain ones of the support bars 140 extending between a land lead 133 and a respective one of the tie bars 120.

Each of the support bars 140 has a generally planar top surface which extends in generally co-planar relation to the top surface of the die pad 110. As is further seen in FIGS. 1-3, each of the support bars 140 is preferably half-etched as indicated by the hatching shown in FIGS. 1 and 3 so as to define a bottom surface which extends in generally co-planar relation to the half-etched portion 111 of the die pad 110. As a result, in the process of fabricating the semiconductor package 1100 as will be described in more detail below, the encapsulant material used to form the package body of the semiconductor package 1100 is able to flow over the bottom surfaces of the support bars 140, and thus completely covers or encapsulates each support bar 140. Such encapsulation of the support bars 140 prevents the support bars 140 from affecting the connection of the completed semiconductor package 1100 to an external circuit.

The leadframe 100 of the semiconductor package 1100 further comprises a plurality of extension leads 160 which are integrally connected to the land connecting bar 130 and extend outwardly toward the dambar 150. More particularly, the extension leads 160 are segregated into four sets, with the extension leads 160 of each set being integrally connected to and extending generally perpendicularly outward from a respective one of the four peripheral segments defined by the land connecting bar 130. The extension leads 160 of each set are arrange at a predetermined pitch and protrude perpendicularly outward at a predetermined length from a respective one of the peripheral segments of the land connecting bar 130. As seen in FIG. 3, the extension leads 160 of each set are each preferably integrally connected to the central portion 132 of the corresponding peripheral segment of the land connecting bar 130.

As seen in FIGS. 1-3, each of the extension leads 160 is bent to include a first downset 161 and a second downset 162. The first downset 161 of each extension lead 160 is disposed between the second downset 162 and the die pad 110. Due to the inclusion of the first and second downsets 161, 162 therein, each of the extension leads 160 includes a first segment 134 which is disposed between the die pad 110 and the first downset 161, and extends in generally co-planar relation to the die pad 110, a second segment which extends between the first and second downsets 161, 162 and resides on a plane which is elevated above that of the die pad 110, and a third segment which extends between the second downset 162 and the dambar 150 and resides on a plane which is elevated above that of a second segment. Thus, the first segment 134, the second segment and the third segment of each extension lead 160 reside on respective ones of three spaced, generally parallel planes, with the plane upon which the second segment resides being disposed between those planes on which respective ones of the first segment 134 and the third segment reside.

The generally planar bottom surface of the first segment 134 of each extension lead 160 defines a land 137 as shown in FIG. 15B. Thus, such land 137 extends to the inner, distal end of the extension lead 160 defined by the first segment 134 thereof. Additionally, the land 137 defined by each extension lead 160 extends in generally co-planar relation to the generally planar bottom surface of the die pad 110 which is circumvented by the half-etched portion 111, and further extends in generally co-planar relation to the land 135 defined by each land lead 133. Along these lines, the first segment 134 of each extension lead 160 further defines a generally planar top surface which extends in generally co-planar relation to the generally planar top surface of the die pad 110, and also to the generally planar top surfaces of the land leads 133. The third segment of each extension lead extends in generally co-planar relation to the dambar 150. As best seen in FIG. 15B, the lands 135 defined by the land leads 133 of each set are staggered or offset relative to the lands 137 defined by the extension leads 160 of the corresponding set, the lands 135, 137 each being exposed in and substantially flush with an exterior surface defined by the package body of the semiconductor package 1100 so as to be electrically connectable to an underlying substrate such as a printed circuit board.

In addition to defining the land 137, each of the extension leads 160 further includes a wire bonding area 163 defined by the top surface of the second segment thereof which, as indicated above, extends between the first and second downsets 161, 162. Thus, as will be recognized, the wire bonding area 163 is situated at a higher level than the die pad 110. As will be discussed in more detail below, the wire bonding area 163 of each of the extension leads 160 provides an area for the electrical bonding of conductive wires. For ease of the wire bonding, the wire bonding area 163 of each extension lead 160 may be plated with gold or silver, or the leadframe 100 may be pre-plated (i.e., a pre-plated frame or PPF).

In the leadframe 100, some of the extension leads 160 are integrally connected to the dambar 150, with other ones of the extension leads 160 terminating so as to be disposed in spaced relation to the dambar 150. For those extension leads 160 integrally connected to the dambar 150, the third segments of such extension leads 160 include tie bar portions 164 which facilitate the integral connection thereof to the dambar 150. The integral connection of some of the extension leads 160 to the dambar 150 through the use of tie bar portions 164 functions to maintain the flatness of the land connecting bar 130, the land leads 133 and the extension leads 160. When the dambar 150 is removed in a subsequent fabrication step for the semiconductor package 1100, the tie bar portions 164 of the extension leads 160 including the same do not protrude from the package body of the semiconductor package 1100. Accordingly, the tie bar portions 164 can be electrically connected to an external device only via the land 137 of the corresponding extension lead 160. Additionally, in the leadframe 100, the extension leads 160 of each set are preferably formed so as to be staggered or offset relative to the land leads 133 of the corresponding set thereof, as seen in FIGS. 1 and 3. However, as is also seen in FIGS. 1 and 3, it is contemplated that certain ones of the first segments 134 of the extension leads 160 of each set may be linearly aligned with respective ones of the support bars 140 of that set attached to the corresponding peripheral edge segment of the die pad 110.

The leadframe 100 constructed in accordance with the present invention further comprises a plurality of inner leads 170 which are integrally connected to the dambar 150 and extend inwardly toward the die pad 110 in spaced relation thereto. More particularly, the inner leads 170, like the extension leads 160, are preferably segregated into four sets, with each set of the inner lead 170 extending between an adjacent pair of the tie bars 120. The inner leads 170 of each set also extend generally perpendicularly relative to a respective one of the peripheral segments of the dambar 150 at a predetermined length toward the die pad 110, the inner leads 170 of each set also being arranged at a predetermined pitch. Additionally, certain ones of the inner leads 170 of each set have a generally linear configuration, and extend between a respective, adjacent pair of the extension leads 160 in spaced relation thereto. Those inner leads 170 of each set which do not extend between an adjacent pair of the extension leads 160 each preferably have an angled configuration so as to be disposed closer to a respective one of the peripheral edge segments of the die pad 110.

In the leadframe 100, each of the inner leads 170 which extends between an adjacent pair of the extension leads 160 is preferably bent to include a downset 171. Due to the inclusion the downset 171 therein, each of the inner leads 170 includes a first segment which is disposed between the downset 171 and the land connecting bar 130, and a second segment which extends between the downset 171 and the dambar 150. The first segments of the inner leads 170 preferably reside on the same plane as the second segments of the extension leads 160. Similarly, the second segments of the inner leads 170 preferably reside on the same plane as the third segments of the extension leads 160 and the dambar 150. In this regard, each of the inner leads 170 includes a wire bonding area 172 which is defined by the top surface of the first segment thereof and extends from the downset 171 to the distal end of the inner lead 170 defined by the first segment. The wire bonding areas 172 of the inner leads 170 extend in generally co-planar relation to the wire bonding areas 163 of the extension leads 160. Like the wire bonding areas 163 of the extension leads 160, the wire bonding areas 172 of the inner leads 170 provide areas for the electrical bonding of conductive wires, as will be described in more detail below. It is contemplated that for ease of wire bonding, gold or silver may be plated on the wire bonding areas 172 as well. Alternatively, as indicated above, the leadframe 100 may be a pre-plated leadframe (PPF) to provide enhanced wire bonding areas.

The leadframe 100 constructed in accordance with the present invention further comprises a plurality of outer leads 180 which are also each integrally connected to the dambar 150 and extend outwardly away from the die pad 110. More particularly, the outer leads 180 are also preferably segregated into four sets, with each set of the outer leads 180 extending generally perpendicularly relative to a respective one of the peripheral segments of the dambar 150 in a predetermined length. The outer leads 180 of each set are also arranged at a predetermined pitch, and are preferably linearly aligned with respective ones of the inner leads 170 of the corresponding set thereof. In the leadframe 100, the outer leads 180, the dambar 150, the second segment of the inner leads 170, and the third segments of the extension leads 160 all reside on a common plane. In the process of fabricating the semiconductor package 1100 as will be described in more detail below, the dambar 150 is ultimately singulated in a manner wherein each outer lead 180 remains integrally connected to a respective one of the inner leads 170, with each connected pair of the inner and outer leads 170, 180 being electrically isolated from every other connected pair thereof. The singulation of the dambar 150, coupled with the removal of the dambar 130, also occurs in a manner wherein the extension leads 160 are electrically isolated from each other, from the land leads 133, and from each connected pair of the inner and outer leads 170, 180.

The leadframe 100 may be fabricated from a conventional metal material, such as copper, copper alloy, steel plated with copper, or a functional equivalent. However, those of ordinary skill in the art will recognize that the present invention is not limited to any particular material for the leadframe 100. Additionally, the number of land leads 133, extension leads 160, inner leads 170 and outer leads 180 shown in FIGS. 1 and 3 is for illustrative purposed only, and may be modified according to application field. Along these lines, the land leads 133, extension leads 160, inner leads 170 and outer leads 180 may have designs or configurations varying from those shown in FIG. 1 and three without departing from the spirit and scope of the present invention. Additionally, though the land leads 133, extension leads 160, inner leads 170 and outer leads 180 are each shown as being segregated into four sets, it will be recognized that fewer sets thereof may be provided, and may be arranged along any combination of two or three of the peripheral sides of the die pad 110. Moreover, less than four tie bars 120 may be included in the leadframe 100, extending to respective corners of the die pad in any combination. It is further contemplated that the leadframe 100 may be fabricated through the implementation of a chemical etching process or alternatively a mechanical stamping process.

In fabricating the leadframe 100, a force must be applied to form the downsets 121, 122 in the tie bars 120, the downsets 161, 162 in the extension leads 160, and the downsets 171 in the inner leads 170. If the force is applied to only portions of the leadframe 100 where these particular downsets are to be formed, the force is unbalanced and the downsets are formed in different directions, presenting the danger that the land connecting bar 130 may be deformed, with the land leads 133 and lands 135 defined thereby being misaligned (i.e., lacking flatness). However, since the width of the outer portions 131 of each peripheral segment of the land connecting bar 130 is smaller than that of the corresponding central portion 132 as indicated above, stress arising from the formation of the aforementioned downsets can be reduced to prevent the land connecting bar 130 from being deformed during the formation of such downsets. As indicated above, the width of the outer portions 131 of each peripheral segment of the land connecting bar 130 is in the range of from about 85% to 90% of that of the corresponding central portion 132. If the width of the outer portions 131 is smaller than about 85% of the width of the corresponding central portion 132, the land connecting bar 130 is likely to be cut or curved, which makes it difficult to maintain the flatness of the land connecting bar 130 and hence the lands 135 defined by the land leads 133. That is, since the lands 135 may lose their flatness during the formation of the aforementioned downsets, they may be buried in the encapsulant material used to form the package body of the semiconductor package 1100 including the leadframe 100. Additionally, in the leadframe 100, the chamfer portions 131a of the outer portions 131 of the peripheral segments of the land connecting bar 130 can be vibrated upward and downward to absorb stress arising from the formation of the aforementioned downsets, thereby further preventing the land connecting bar 130 from being deformed during such formation. Moreover, the support bars 140 also serve to maintain the position of the land connecting bar 130 during the formation of these downsets. Along these lines, since the support bars 140 are each connected to the land connecting bar 130, they assist in preventing the land leads 133 and the extension leads 160 from being deformed, and further assist in maintaining the flatness of the land connecting bar 130.

Referring now to FIGS. 15A, 15B and 16, the semiconductor package 1100 as fabricated to include the leadframe 100 is shown in detail. As will be recognized by those of ordinary skill in the art, in the completed semiconductor package 1100 shown in FIGS. 15A, 15B and 16, the dambar 150 and the land connecting bar 130 are each singulated or removed from the leadframe 100 to facilitate the electrical isolation of the various structural features of the leadframe 100 from each other. More particularly, the dambar 150 and the land connecting bar 130 are singulated in a manner wherein each outer lead 180 remains integrally connected to a respective one of the inner leads 170, with each connected pair of the inner and outer leads 170, 180 being electrically isolated from every other connected pair thereof. The singulation of the dambar 150 and the land connecting bar 130 also occur in a manner wherein the extension leads 160 are electrically isolated from each other, from the land leads 133 and from each connected pair of the inner and outer leads 160, 170, with the land leads 133 being electrically isolated from each other, from the extension leads 160 and from each connected pair of the inner and outer leads 160, 170.

In the semiconductor package 1100, a semiconductor die 192 is attached to the top surface of the die pad 110 through the use of an adhesive layer 191. The semiconductor die 192 includes a plurality of bond pads 192a which are disposed on the top surface thereof opposite the bottom surface adhered to the adhesive layer 191. The bond pads 192a are used to deliver and receive electrical signals.

The semiconductor package 1100 further comprises a plurality of conductive wires 193 which are used to electrically connect the bond pads 192a of the semiconductor die 192 to respective ones of the land leads 133, extension leads 160 and the inner leads 170. The conductive wires 193 may be fabricated from aluminum, copper, gold, silver, or a functional equivalent. However, those of ordinary skill in the art will recognize that the present invention is not limited to any particular material for the wires 193. One or more conductive wires 193 may also be used to electrically connect one or more bond pads 192a of the semiconductor die 191 directly to the die pad 110. In this regard, though not shown, the peripheral edge portion of the top surface or the entire top surface of the die pad 110 may be plated and bonded with conductive wires 193, allowing for the use of the plated die pad 110 as a ground region.

In the semiconductor package 1100, in electrically connecting the bond pads 192a to the land leads 133, it is contemplated that the conductive wires 193 will be extended from the bond pads 192a to the top surfaces defined by the land leads 133. In electrically connecting the bond pads 192a to the extension leads 160, it is contemplated that the conductive wires 193 will be extended from the bond pads 192a to the wire bonding areas 163 defined by the second segments of respective ones of the extension leads 160. However, it is contemplated that the electrical connection of the bond pads 192a of the semiconductor die 192 to the extension leads 160 may be facilitated by extending the conductive wires 193 between the bond pads 192a and the top surfaces of the first segments of respective ones of the extension leads 160. The electrical connection of the bond pads 192a of the semiconductor die 192 to the inner leads 170 is preferably facilitated by extending the conductive wires 193 from the bond pads 192a to the wire bonding areas 172 defined by the first segments of respective ones of the inner leads 170. Since the wire bonding areas 163 of the extension leads 160 extend in generally co-planar relation to the wire bonding areas 172 of the inner leads 170, the conductive wires 193 can be bonded to the wire bonding areas 163, 172 by repeatedly reciprocating capillaries at the same height to maintain constant wiring bonding quality.

In the semiconductor package 1100, the die pad 110, the land leads 133, the tie bars 120, the extension leads 160, the inner leads 170, the semiconductor die 192 and the conductive wires 193 are at least partially encapsulated or covered by an encapsulant material which, upon hardening, forms the package body 194 of the semiconductor package 1100. More particularly, the package body 194 covers the entirety of the die pad 110 except for the bottom surface thereof which is circumvented by the half-etched portion 111. The package body 194 also covers the entirety of each of the land leads 133 except for the land 135 defined thereby, as well as the entirety of each of the extension leads 160 except for the land 137 defined thereby and a small portion of the third segment thereof. The package body 194 also covers the entirety of each of the inner leads 170 except for a small portion of the second segment thereof. The entirety of each of the tie bars 120 is also covered by the package body 194, except for the bottom surface of the first segment of each tie bar 120 which extends in generally co-planar relation to the bottom surface of the die pad 110 and the lands 135, 137 defined by the land and extension leads 133, 160, all of which are exposed in a generally planar bottom surface 194b defined by the package body 194. The outer leads 180 of the leadframe 100 are not covered by the package body 194, but rather protrude or extend outwardly from respective lateral side surfaces 194a thereof. The dambar 150 is also not covered by the package body 194 so that it may be removed from the leadframe 100.

Though the land connecting bar 130 is partially covered by the package body 194, the bottom surface of the land connecting bar 130 is exposed in the bottom surface 194b so that the land connecting bar 130, like the dambar 150, may be removed from the completed semiconductor package 1100 as needed to facilitate the electrical isolation of various structural features thereof from each other. More particularly, the removal of the land connecting bar 130 is needed to facilitate the electrical isolation of the land leads 133 from each other, and from the extension leads 160, and further to facilitate the electrical isolation of the extension leads 160 from each other. As shown in FIG. 15B, the removal of the land connecting bar 130, which is typically accomplished through the completion of a partial sawing process which will be described in more detail below, facilitates the formation of a plurality of elongate grooves 195 within the bottom surface 194b of the package body 194, such grooves 195 extending in generally perpendicular relation to each other, and generally perpendicularly between an opposed pair of the lateral side surfaces 194a of the package body 194. As indicated above, the package body 194 of the semiconductor package 1100 completely covers or encapsulates each support bar 140, with such encapsulation preventing the support bars 140 from affecting the connection of the completed semiconductor package 1100 to an external circuit.

Due to the structural attributes of the fully formed package body 194, the generally planar bottom surface of the die pad 110 is exposed in and substantially flush with the generally planar bottom surface 194b of the package body 194, as are the generally planar bottom surfaces of the first segments of the tie bars 120. Similarly, the generally planar lands 135, 137 defined by the land and extension leads 133, 160 are exposed in and substantially flush with the bottom surface 194b of the package body 194. The outer leads 180 of each set thereof protrude laterally outward from respective side surfaces 194a of the package body 194. As seen in FIGS. 15A, 15B and 16, the exposed outer leads 180 may be bent to assume a gull-wing configuration to allow the same to be electrically connected to an underlying substrate such as a printed circuit board. As indicated above, in order to complete the fabrication of the semiconductor package 1100 to allow the same to assume the configuration shown in FIGS. 15A and 15B, the dambar 150 and the land connecting bar 130 must each be removed from the leadframe 100 to facilitate the electrical isolation of the land leads 133, the extension leads 160, the inner leads 170 and the outer leads 180 from each other as explained above. In this regard, it is contemplated that a conventionally known debarring process may be implemented to remove the dambar 150. The completion of such debarring process results in each of the extension leads 160 defining an outer, distal end which is exposed in and substantially flush with a respective side surface 194a defined by the package body 194. The removal of the land connecting bar 130 is facilitated by sawing with a blade, the grooves 195 being formed as an artifact of such sawing process.

As indicated above, the outer leads 180 are exposed in the semiconductor package 1100, as are the lands 135, 137 defined by the land and extension leads 133, 160. As a result, the lands 135, 137 are capable of being mounted to the surface of an underlying substrate such as a printed circuit board through the use of, for example, a soldering technique. Electrical signals are routed between the lands 135, 137 and the semiconductor die 192 by the corresponding land and extension leads 133, 160 and conductive wires 193. Similarly, electrical signals may be routed from the semiconductor die 192 to the outer leads 180 by the corresponding integrally connected inner leads 170 and conductive wires 193. Like the lands 135, 137, the outer leads 180 may be surface mounted to an underlying substrate such as a printed circuit board through the use of, for example, a soldering technique. Since the leadframe 100 of the semiconductor package 1100 is configured to provide the outer leads 180 which protrude from the side surfaces 194a of the package body 194 and the lands 135, 137 which are exposed in the bottom surface 194b of the package body 194, the number of I/O's in the leadframe 100 increases in proportion to the number of the outer leads 180 and the lands 135, 137.

Figure 17:
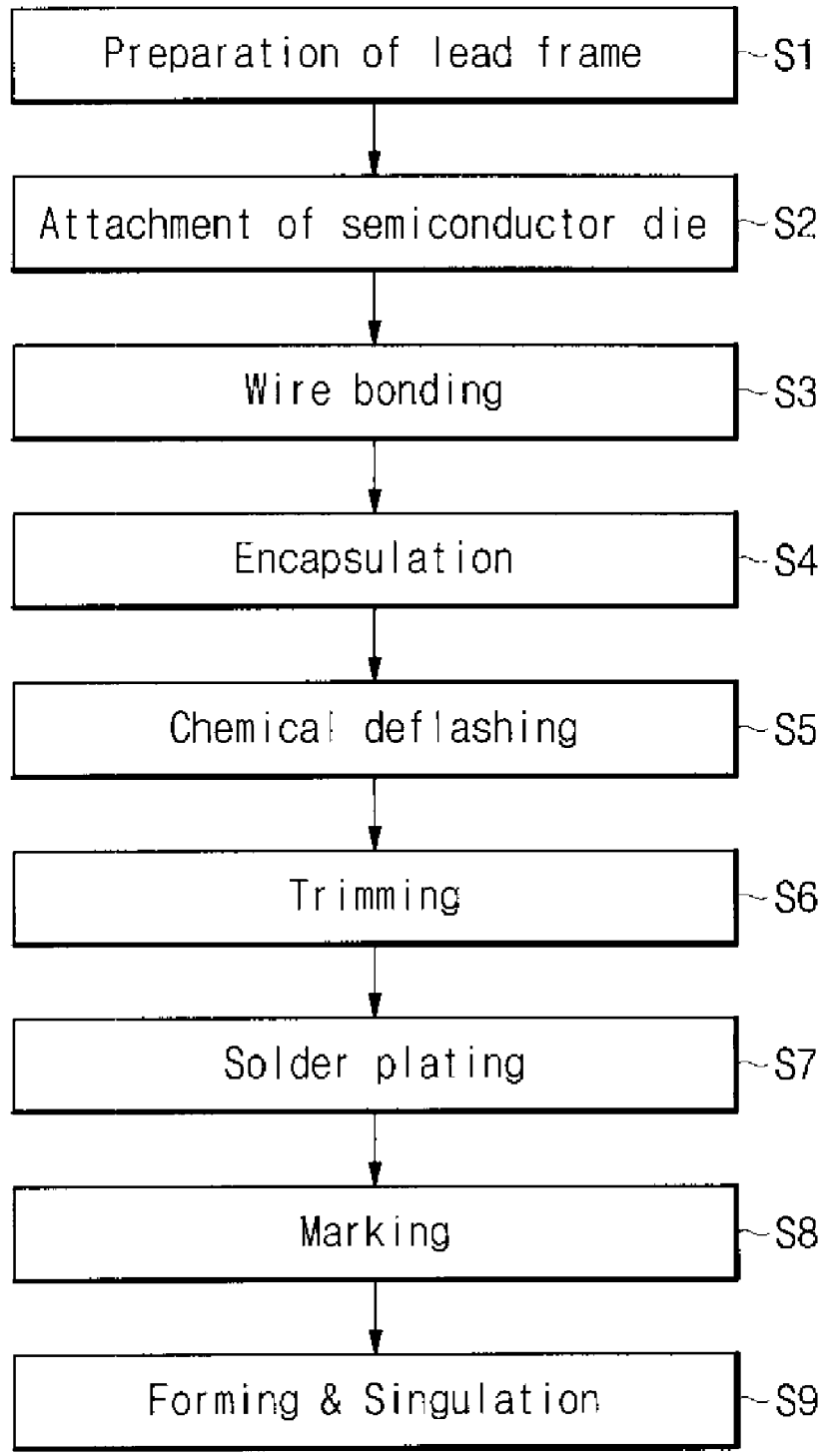
FIG. 17 is a flow chart illustrating an exemplary fabrication method for the semiconductor package shown in FIGS. 15A, 15B and 16.

Referring now to FIG. 17, there is provided a flow chart which sets forth an exemplary method for fabricating the semiconductor package 1100 of the present invention. The method comprises the steps of preparing the leadframe (S1), semiconductor die attachment (S2), wire bonding (S3), encapsulation (S4), chemical deflashing (S5), trimming (S6), solder plating (S7), marking (S8), and forming and singulation (S9). FIGS. 18A-18I provide illustrations corresponding to these particular steps, as will be discussed in more detail below.

Figure 18A:
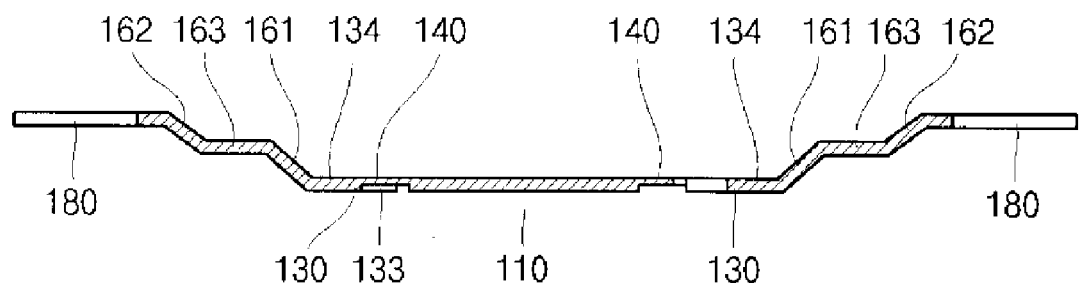
FIGS. 18A-18I are views illustrating an exemplary fabrication method for the semiconductor package shown in FIGS. 15A, 15B and 16.
Figure 18B:
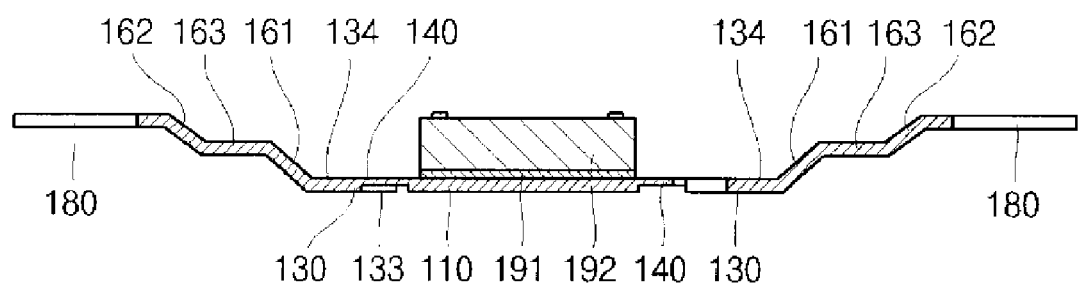

Referring now to FIG. 18A, in the initial step S1 of the fabrication process for the semiconductor package 1100, the leadframe 100 having the above-described structural attributes is provided. Thereafter, as illustrated in FIG. 18B, step S2 is completed wherein the semiconductor die 192 having the bond pads 192a is attached to the top surface of the die pad 110 of the leadframe 100 through the use of the adhesive layer 191. The adhesive layer 191 can be selected from well known liquid epoxy adhesives, adhesive films and adhesive tapes, as well as equivalents thereto.

Figure 18C:
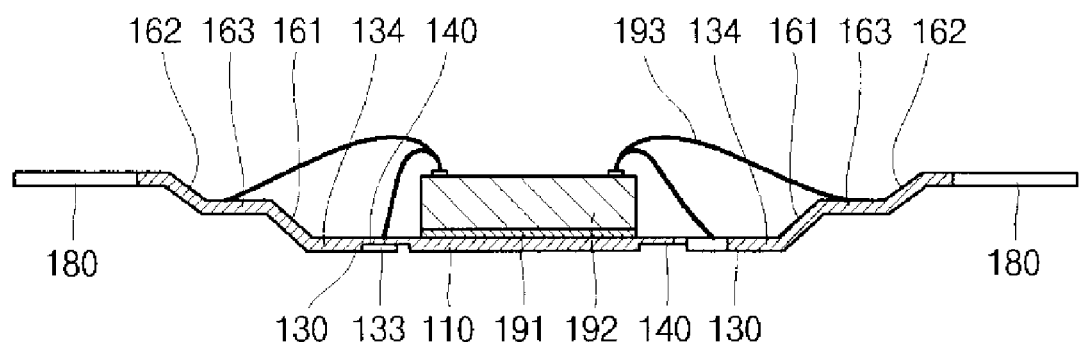
Figure 18D:
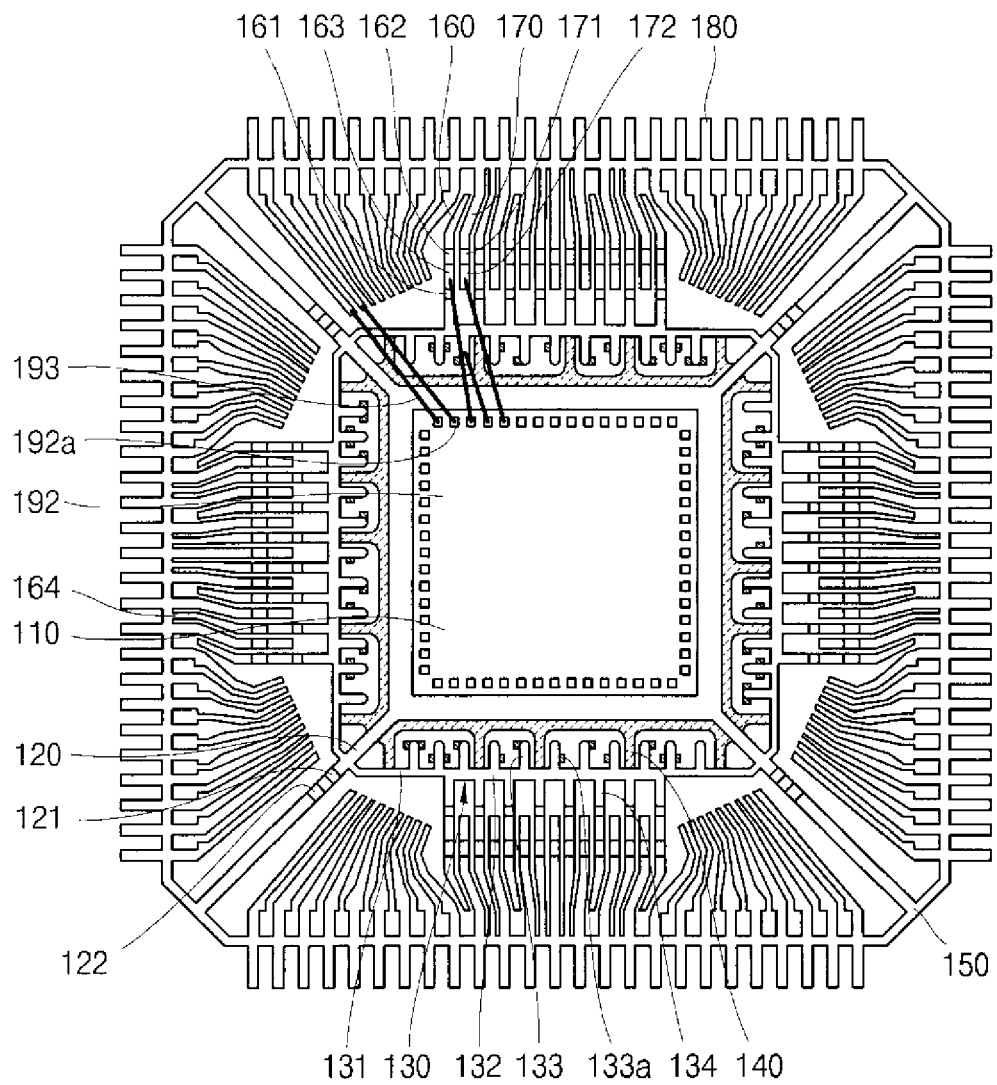

Referring now to FIGS. 18C and 18D, in the next step S3 of the fabrication process, the conductive wires 193 are used to electrically interconnect the semiconductor die 210 to the leadframe 100 in the aforementioned manner. Specifically, the bond pads 192a of the semiconductor die 191 are electrically connected to the land leads 133, the extension leads 160 and the inner leads 170. Though not shown, as indicated above, one or more conductive wires 193 may also be used to electrically connect one or more bond pads 192a of the semiconductor die 191 directly to the die pad 110, allowing for the use of the die pad 110 as a ground region. Though also not shown, some of the land leads 133 serving as grounds may be electrically connected to a peripheral portion of the die pad 110 to achieve maximum electrical ground effects. More particularly, a wire bonding area (not shown) may be formed on an outer peripheral portion of the top surface of the die pad 110. Additionally, a U-shaped or V-shaped groove may be formed between such wire bonding area and the semiconductor die 192 so that the adhesive 191 used to facilitate the attachment of the semiconductor die 192 to the die pad 110 does not flow into the peripheral wire bonding area.

Figure 18E:
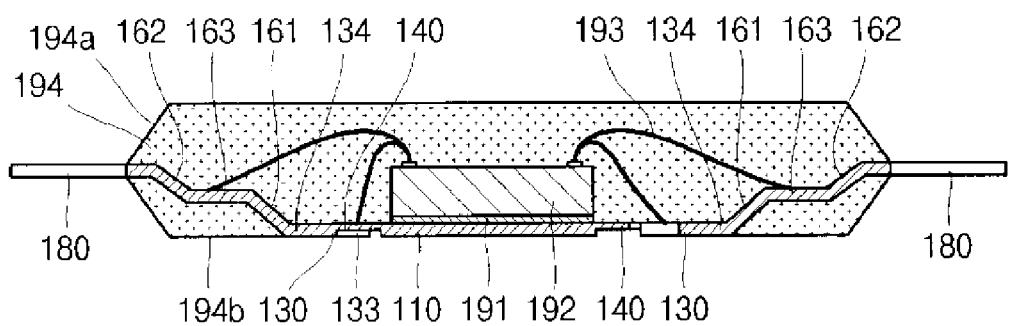
Figure 18F:
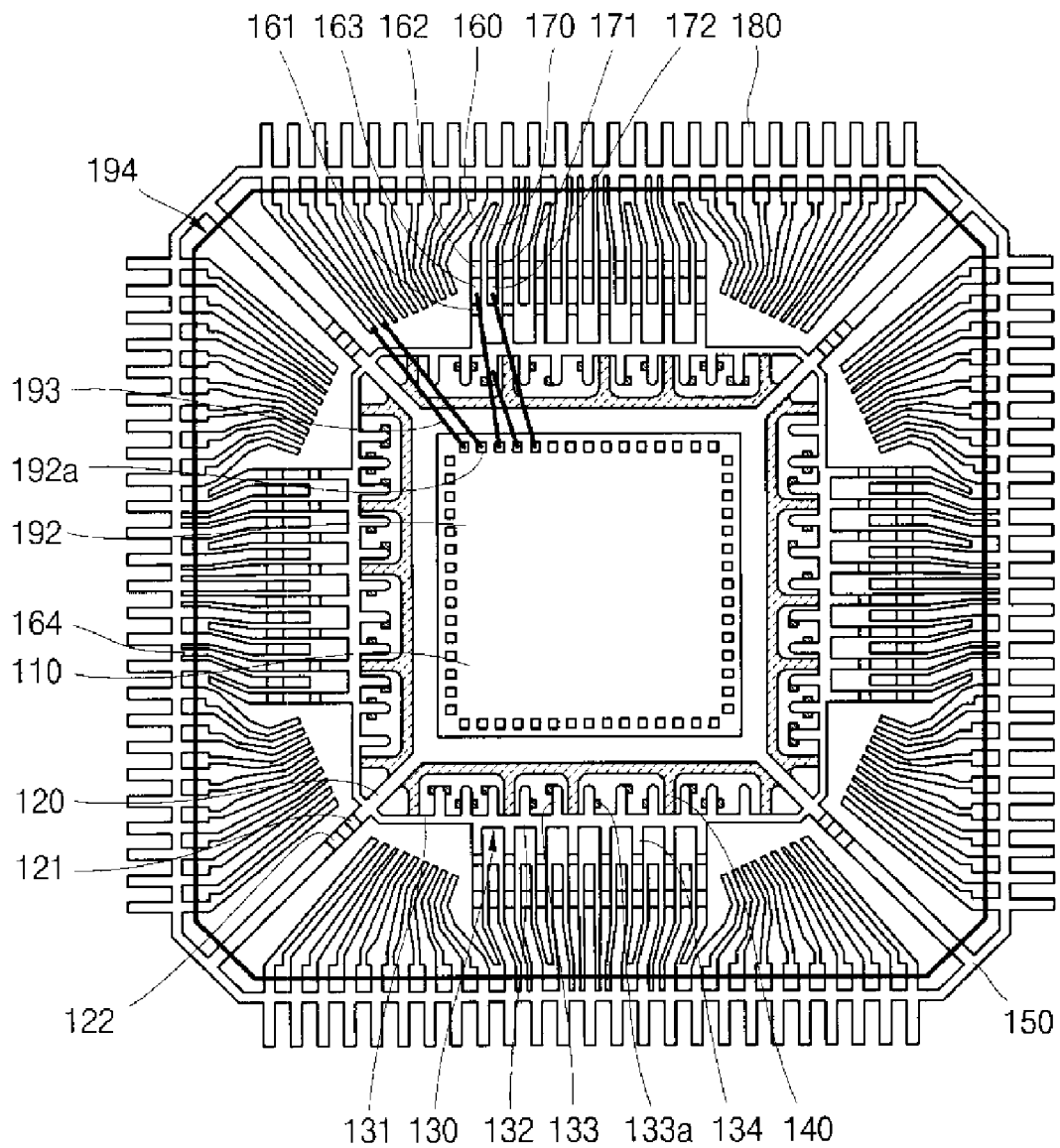

Referring now to FIGS. 18E and 18F, in the next step S4 of the fabrication process for the semiconductor package 1100, portions of the leadframe 100, the semiconductor die 191 and the conductive wires 193 are encapsulated with an encapsulant material which, upon hardening, forms the package body 194 of the semiconductor package 1100. More particularly, the package body 194 covers the entirety of the die pad 110 except for the bottom surface thereof which is circumvented by the half-etched portion 111. The package body 230 also covers the entirety of each of the land leads 133 except for the land 135 defined thereby, as well as the entirety of each of the extension leads 160 except for the land 137 defined thereby and a small portion of the third segment thereof. The package body 194 also covers the entirety of each of the inner leads 170 except for a small portion of the second segment thereof. The entirety of each of the tie bars 120 is also covered by the package body 194, except for the bottom surface of the first segment of each tie bar 120 which extends in generally co-planar relation to the bottom surface of the die pad 110 and the lands 135, 137. The outer leads 180 of the leadframe 100 are not covered by the package body 194. The dambar 150 is also not covered by the package body 230 so that it may be removed from the leadframe 100. Though the land connecting bar 130 is partially covered by the package body 194, the bottom surface of the land connecting bar 130 is exposed in the bottom surface 194b so that the land connecting bar 130, like the dambar 150, may be removed from the completed semiconductor package 1100.

Subsequent to the formation of the package body 194 in step S4, chemical deflashing (step S5) may be performed if films of flash (a resin component of the encapsulant material) are formed on the bottom surface of the die pad 110 and upon the lands 135, 137. If such thin films of flash are present as could impede the ability to mount the semiconductor package 1100 to an underlying substrate, the removal of such flash films by a chemical etching method is required.

Figure 18G:
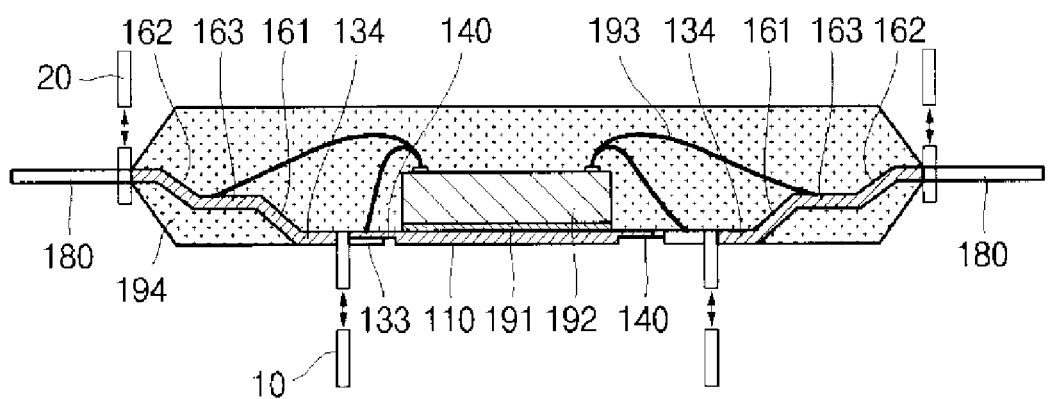
Figure 18H:
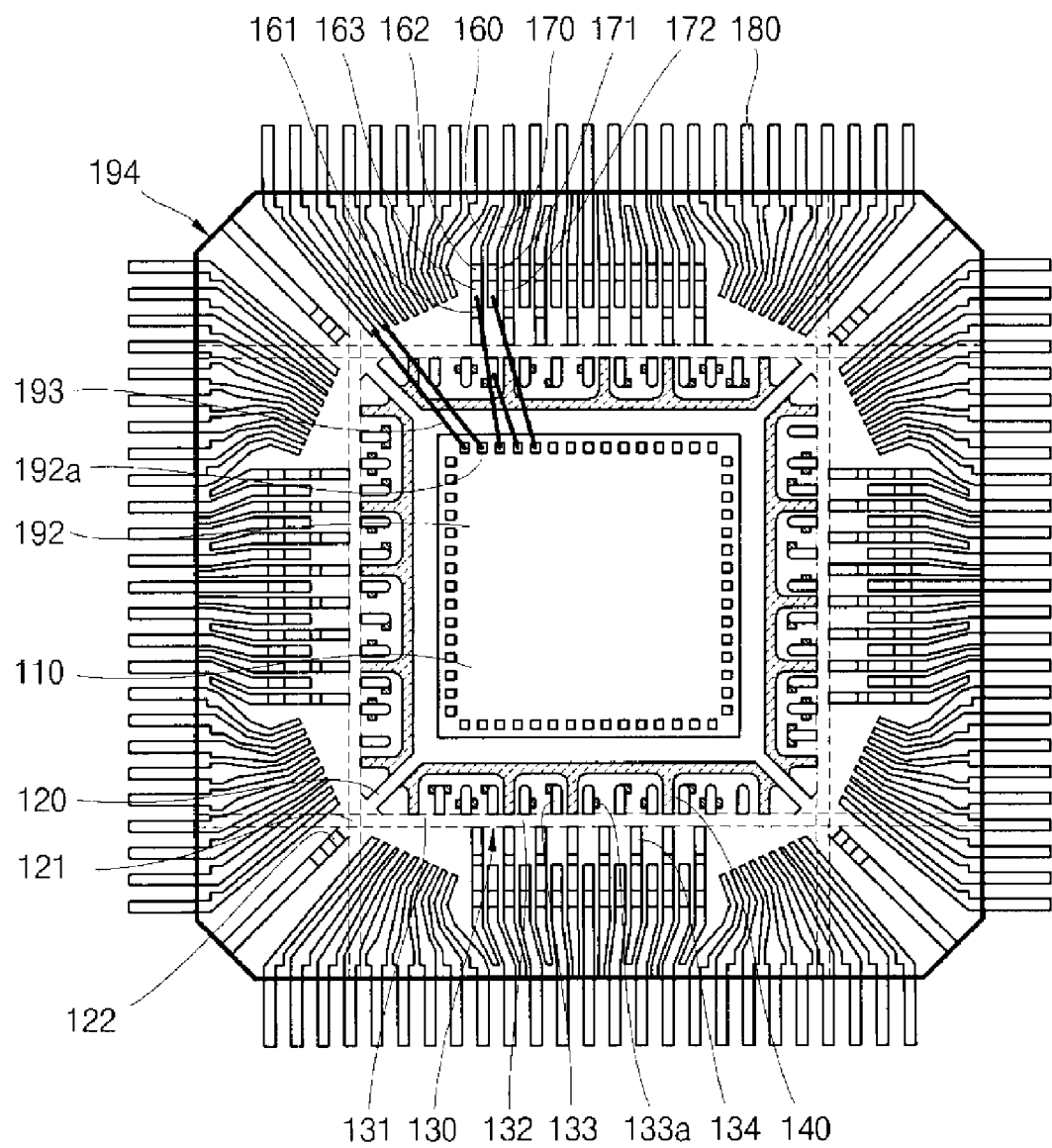

Referring now to FIGS. 18G and 18H, in the next step S6 of the fabrication process for the semiconductor package 1100, the removal of the land connecting bar 130 is facilitated by sawing with a blade 10, the grooves 195 being formed as an artifact of such sawing process. The removal of the land connecting bar 130 is needed to facilitate the electrical isolation of the land leads 133 from each other and from the extension leads 160, and further to facilitate the electrical isolation of the extension leads 160 from each other. Additionally, the dambar 150 is trimmed or removed by cutting with a cutting tool 20 so that the extension leads 160, the inner leads 170 and the outer leads 180 are electrically isolated from each other in the above described manner. As previously explained, the dambar 150 is positioned outside of the package body 194 to allow for the removal thereof from the leadframe 100, and is removed by cutting the same with dambar cutting tool 20. In addition, portions of the extension leads 160 and tie bars 120 protruding from the side surfaces 194a of the package body 194 are also completely removed during the trimming process.

Upon the completion of step S6, a solder plating step (step S7) may also be performed in the fabrication process for the semiconductor package 1100. More particularly, after the land connecting bar 130, dambar 150 and portions of the extension leads 160 have been removed using the dambar cutting tool 20, some metal areas of the leadframe 100 susceptible to oxidation are exposed to air. Since the leadframe 100 is typically made of copper, the same is susceptible to oxidation. In order to prevent the oxidation of the exposed metal areas of the leadframe 100, all elements (e.g. the extension leads 160) of the leadframe 100 exposed outside of the encapsulant 194 may be plated by soldering. Subsequent to the completion of any such solder plating step (step S7), a marking step (step S8) may be performed upon the semiconductor package 1100. More particularly, ink or a laser may be used to mark the product name, the manufacturer of the semiconductor package 1100, etc. on a prescribed surface of the package body 194.

Figure 18I:
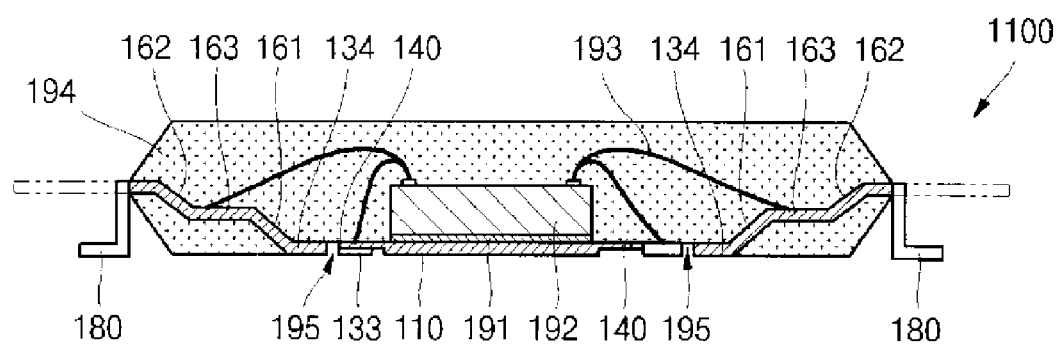

Referring now to FIG. 18I, in the next step S9 of the fabrication process for the semiconductor package 1100, the outer leads 180 protruding from the package body 194 are formed in appropriate shapes. Specifically, the exposed outer leads 180 protruding from the side surfaces 194a of the package body 194 may be formed into predetermined shapes using a lead forming tool (not shown) to allow the semiconductor package 1100 to have a shape suitable for mounting to an external unit or an underlying substrate. Although the outer leads 180 are depicted as being formed outwardly relative to the package body 194 in FIG. 18I, those of ordinary skill in the art will recognize that the outer leads 180 can alternatively be formed downwardly and inwardly relative to the package body 194. Thereafter, portions of the tie bars 120 protruding outwardly from the package body 194 are cut to separate the semiconductor package 1100 from the leadframe 100.

Figure 4:
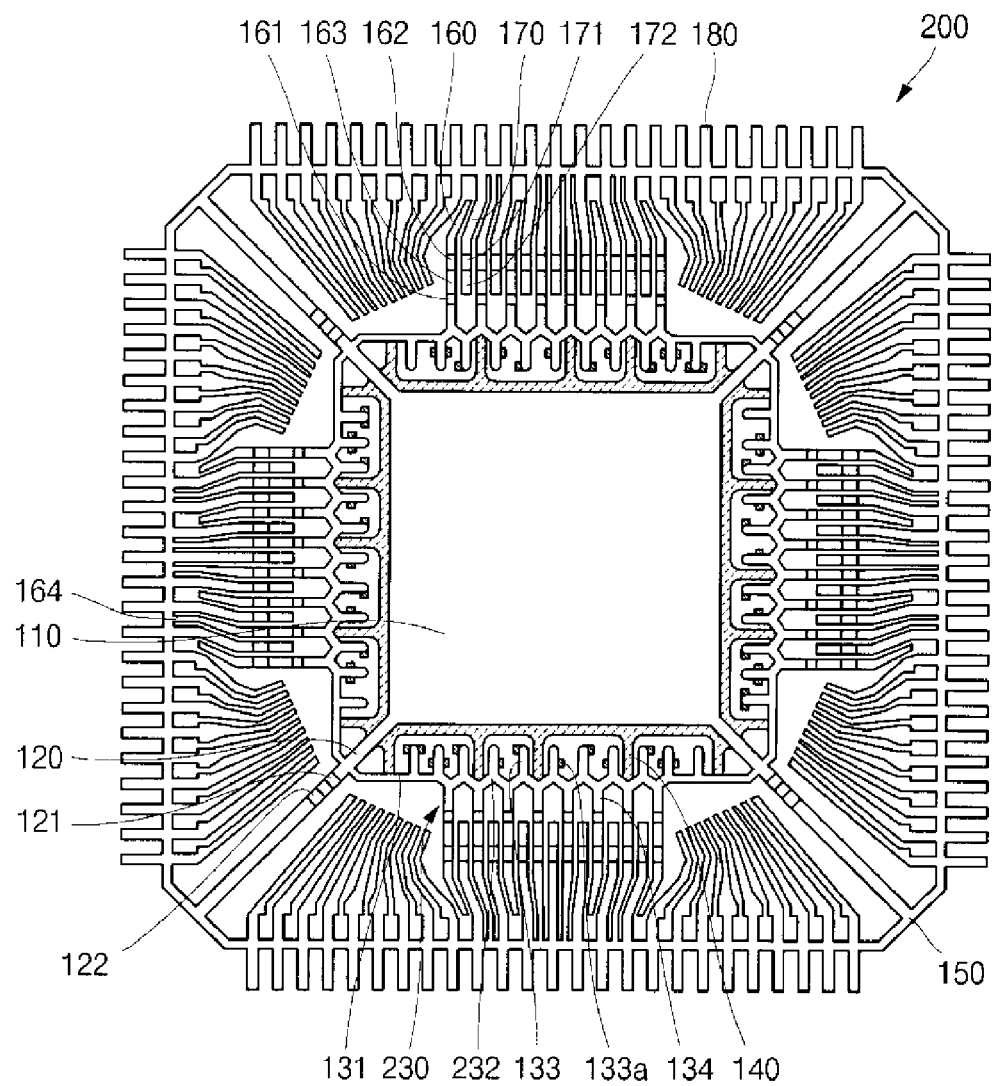
FIG. 4 is a top plan view of an unsingulated leadframe which is integrated into a semiconductor package constructed in accordance with a second embodiment of the present invention.

Referring now to FIG. 4, there is shown a leadframe 200 constructed in accordance with a second embodiment of the present invention. The leadframe 200 is substantially similar in structure to the leadframe 100, with only the differences between the leadframes 100, 200 being described below.

The sole distinction between the leadframes 100, 200 lies in the structural attributes of the land connecting bar 230 of the leadframe 200, in comparison to the land connecting bar 130 of the leadframe 100. As seen in FIG. 4, each of the four peripheral segments of the land connecting bar 230 includes a spaced pair of outer portions 131, and a central portion 232 which extends between and interconnects the outer portions 131. However, in contrast to the linear configuration of the central portion 132 of each peripheral segment of the land connecting bar 130, the central portion 232 of each peripheral segment of the land connecting bar 230 has a serpentine or zigzag configuration.

In the process of fabricating a semiconductor package including the leadframe 200, the removal of the land connecting bar 230 is generally facilitated by friction during sawing with a blade. The formation of the central portions 232 of each peripheral segment of the land connecting bar 232 in a zigzag configuration can reduce the friction area of the land connecting bar 230 with a blade during sawing. In addition, even when the direction of travel of the blade is not consistent with the direction of the outer portions 131 of a corresponding peripheral segment of the land connecting bar 230, such peripheral segment of the land connecting bar 230 can still be readily removed by the blade. Additionally, the zigzag configuration of the central portions 232 of the peripheral segments of the land connecting bar 230 allow the land connecting bar 230 to be completely removed by sawing with a blade while leaving no metal burrs. Further, any solder plate is not melted during sawing with a blade, which prevents shorting between the lands 135, 137. Moreover, the areas of the lands 135, 137 which extend from the central portions 232 of the peripheral segments of the land connecting bar 230 are not greatly reduced by the sawing of the land connecting bar 230 with a blade.

Figure 5:
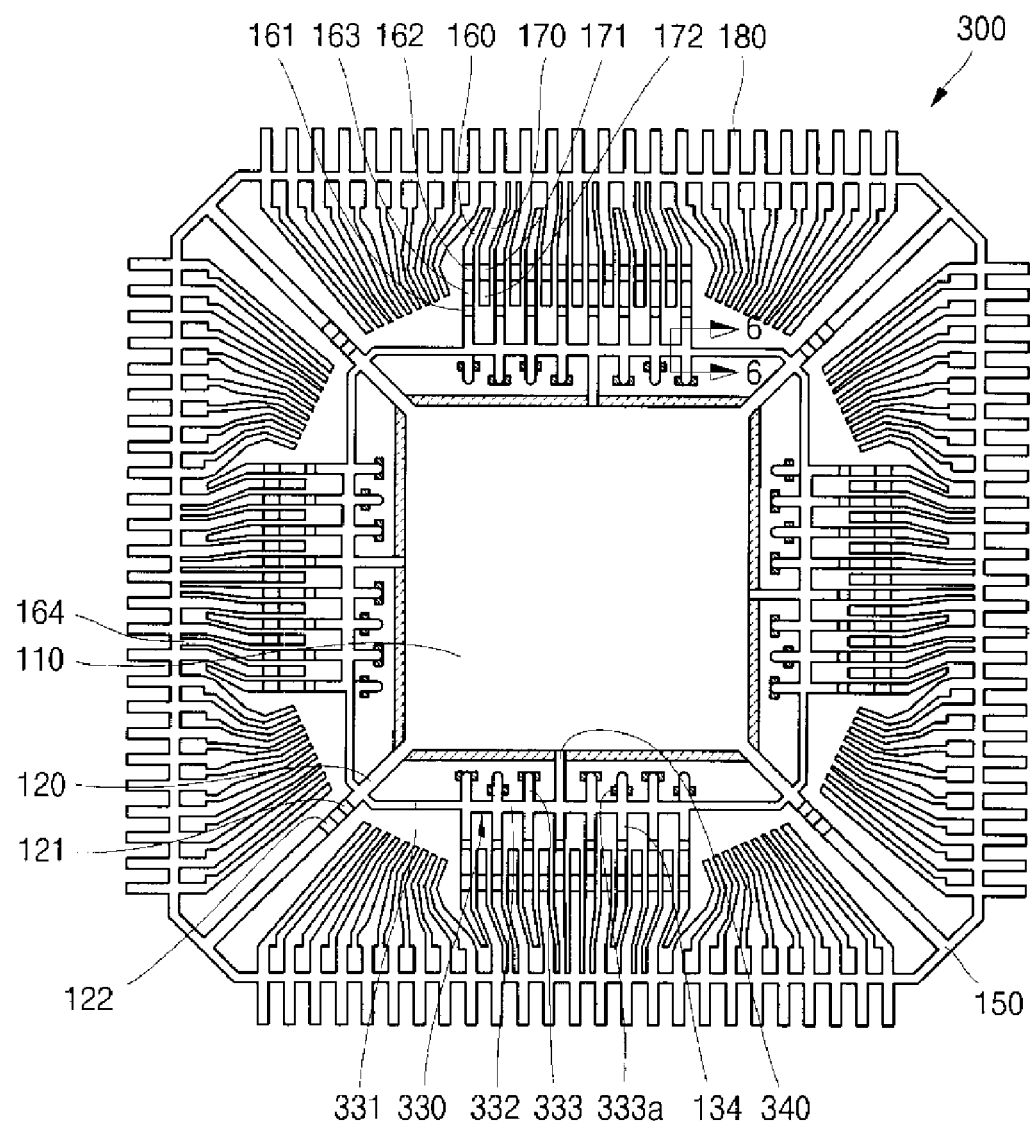
FIG. 5 is a top plan view of an unsingulated leadframe which is integrated into a semiconductor package constructed in accordance with a third embodiment of the present invention.
Figure 6A:
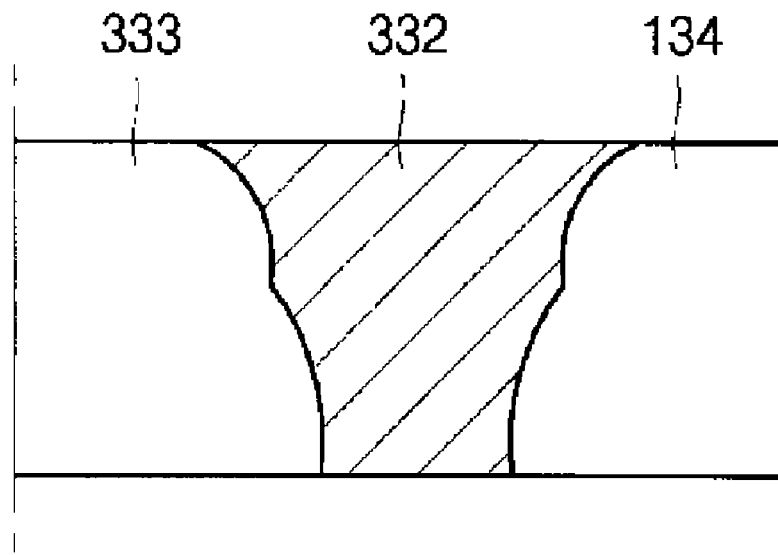
FIG. 6A is a cross-sectional view of the leadframe taken along line 6-6 of FIG. 5.

Referring now to FIGS. 5 and 6A, there is shown a leadframe 300 constructed in accordance with a third embodiment of the present invention. The leadframe 300 is also substantially similar in structure to the leadframe 100, with only the differences between the leadframes 100, 300 being described below.

The primary structural distinction between the leadframes 100, 300 lies in the structural attributes of the land connecting bar 330 of the leadframe 300 in comparison to the land connecting bar 130 of the leadframe 100. Each of the four peripheral segments of the land connecting bar 330 includes a spaced pair of outer portions 331 and a central portion 332 which extends between and interconnects the outer portions 331. Within each peripheral segment of the land connecting bar 330, the outer portions 331 are of identical width which is less than that of the central portion 332. Additionally, as seen in FIG. 6A, the central portion 332 of each peripheral segment of the land connecting bar 330 may be tapered upwardly (i.e., may have a reverse taper). Any method may be used to form the central portions 332 of the land connecting bar 330 to have the structural attributes shown in FIG. 6A. For example, the central portions 332 may be formed by partial etching. Such partial etching can be performed by isotropic etching as a wet etching technique.

A further distinction between the leadframes 100, 300 lies in the orientation of the land leads 333 of each set included in the leadframe 300 in comparison to the land leads 133 of each set included in the leadframe 100. More particularly, in the leadframe 300, the land leads 333 of each set are linearly aligned with a respective one of the extension leads 160 of a corresponding set thereof. This is in contrast to the leadframe 100 wherein the land leads 133 of each set are staggered or offset relative to the extension leads 160 of the corresponding set thereof. Like the land leads 133 described above, the land leads 333 of the leadframe 300 may also include one or more locking protrusions 333a at one or both sides thereof, such locking protrusions 333a being identical to the locking protrusions 133a described above in relation to the lead lands 133.

A still further distinction between the leadframes 100, 300 lies in the reduction of the number of support bars 340 included in the leadframe 300, in comparison to the number of support bars 140 included in the leadframe 100. In addition to being reduced in number, the support bars 340 included in the leadframe 300 may not be half-etched as are the support bars 140 described above.

Figure 6B:
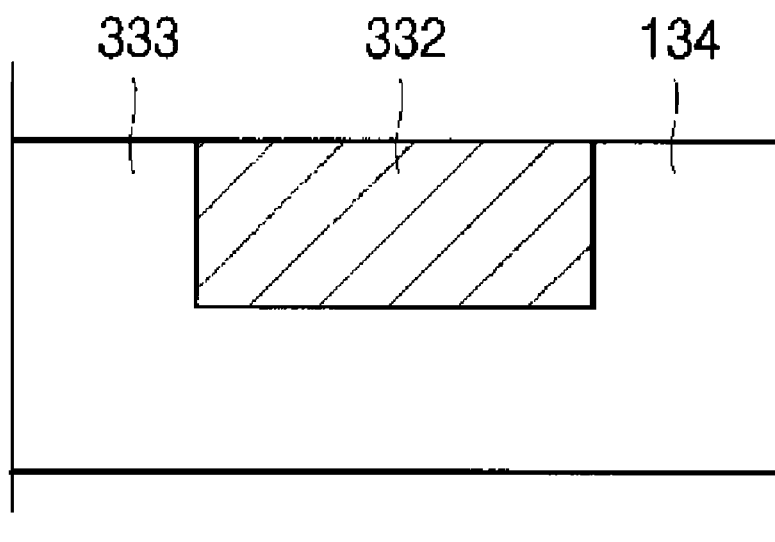
FIG. 6B is a cross-sectional view similar to FIG. 6A, but depicting a potential variant of the leadframe shown in FIG. 5.

In accordance with a potential variant of the leadframe 300 shown in FIGS. 5 and 6A, the central portion 332 of each peripheral segment of the land connecting bar 330 may be half-etched to assume the configuration shown in FIG. 6B, rather than being partially etched to have a reverse taper as shown in FIG. 6A. The half etching of the central portions 332 of the peripheral segments of the land connecting bar 330 to assume the configuration shown in FIG. 6B can be performed by dry etching. Examples of suitable dry etching techniques include, but are not limited to, plasma etching, sputtering etching and reactive ion etching.

Though not shown in FIG. 5, 6A or 6B, the outer portions 331 of each peripheral segment of the land connecting bar 330 can also be partially etched or half-etched. Such etching may be performed in the same manner described above in relation to the partial etching or half-etching of the central portions 332 of each peripheral segment of the land connecting bar 330. The partial etching or half-etching of the central portions 332 alone or combination with the outer portions 331 within each peripheral segment of the land connecting bar 330 enables the land connecting bar 330 to be removed with a smaller frictional force upon sawing with a blade. Therefore, tiny metal burrs formed during sawing are completely removed to prevent shorting between the lead lands 333 and the extension leads 160.

Figure 7:
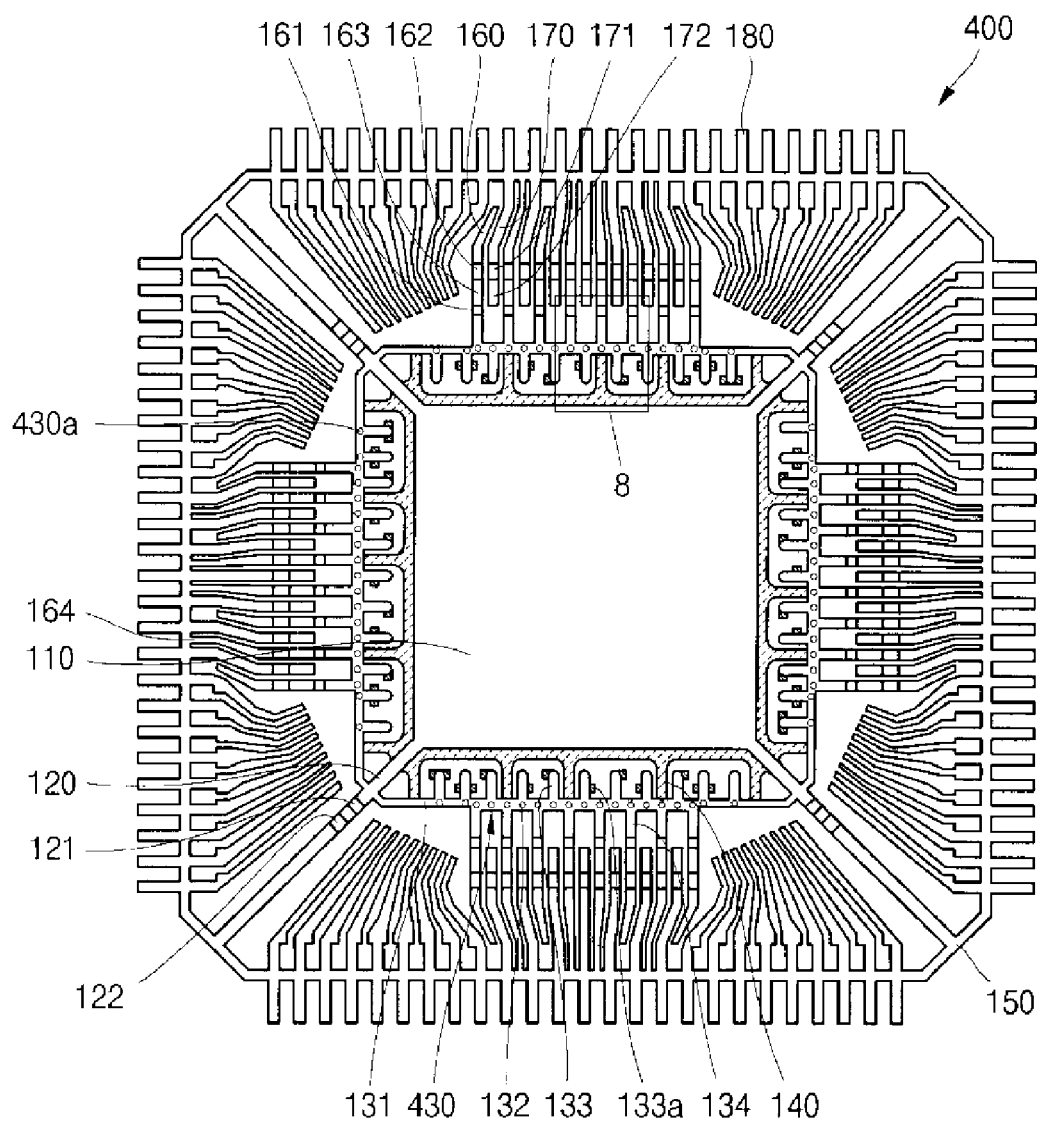
FIG. 7 is a top plan view of an unsingulated leadframe which is integrated into a semiconductor package constructed in accordance with a fourth embodiment of the present invention.
Figure 8:
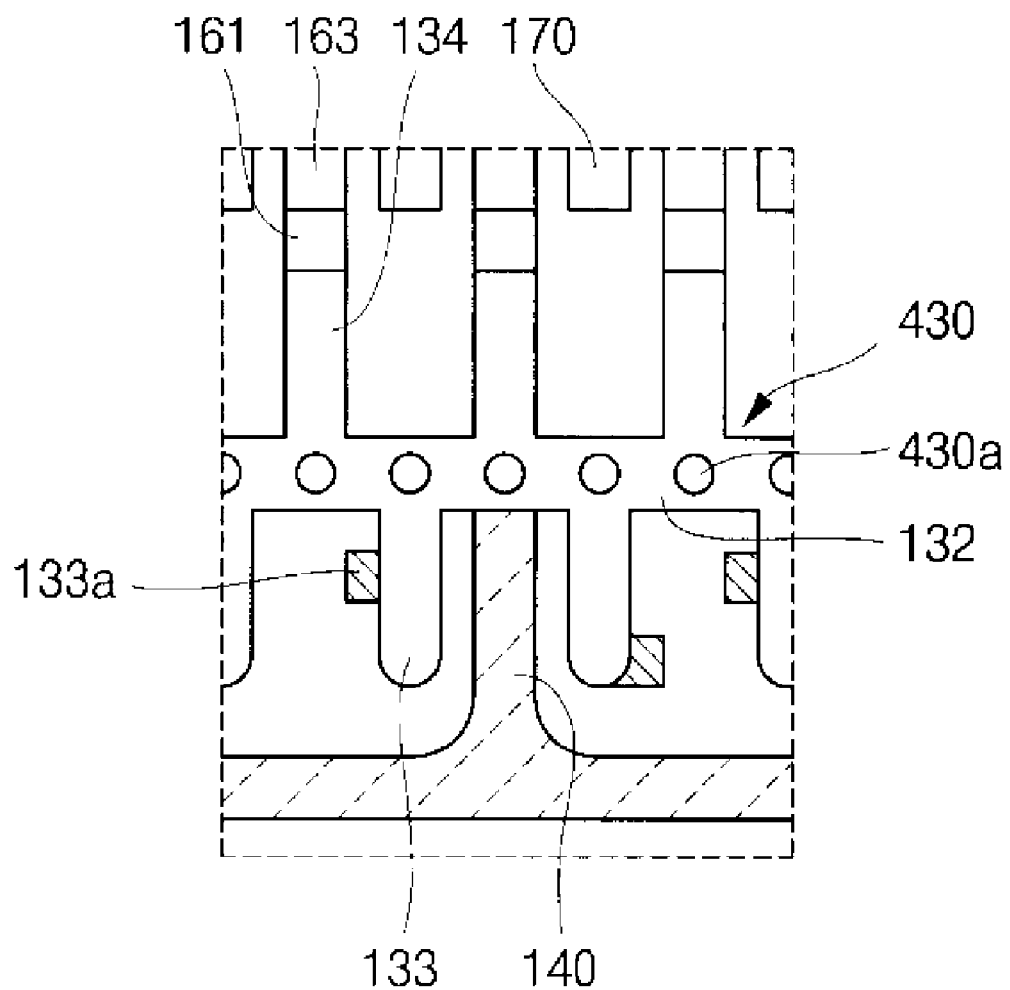
FIG. 8 is an enlargement of the region 8 included in FIG. 7.

Referring now to FIGS. 7 and 8, there is shown a leadframe 400 constructed in accordance with a fourth embodiment of the present invention. The leadframe 400 is also substantially similar in structure to the leadframe 100, with only the distinctions between the leadframes 100, 400 being described below.

The sole distinction between the leadframes 100, 400 lies in the structural attributes of the land connecting bar 430 of the leadframe 400 in comparison to the land connecting bar 130 of the leadframe 100. More particularly, in the land connecting bar 430, each of the four peripheral segments (including the central portion 132 and outer portions 131 of each such peripheral segment) include a plurality of concave recesses or dimples 430a formed on the top and/or bottom surfaces thereof. As is best seen in FIG. 8, the dimples 430a are formed on each peripheral segment of the land connecting bar 430 such that a dimple 430a is included at the intersection or interface of the land connecting bar 430 and each lead land 133, and at the intersection of interface of the land connecting bar 430 and each extension lead 160. Though not illustrated in FIGS. 7 and 8, the dimples 430a can alternatively be replaced by grooves.

The dimples 430a included in the leadframe 400 effectively reduce the contact area between the land connecting bar 430 and a blade during the sawing process used to facilitate the removal of the land connecting bar 430. That is, the land connecting bar 430 having the dimples 430a as easy to remove. Thus, with the configuration of the leadframe 400 shown in FIGS. 7 and 8, occurrences of metal burrs can be substantially reduced or prevented. Consequently, the land leads 133 can be electrically isolated from the extension leads 160 in an easier manner. In addition, the contact area between the land connecting bar 430 and the blade during sawing can be reduced, resulting in an increase in the life of the blade.

Figure 9:
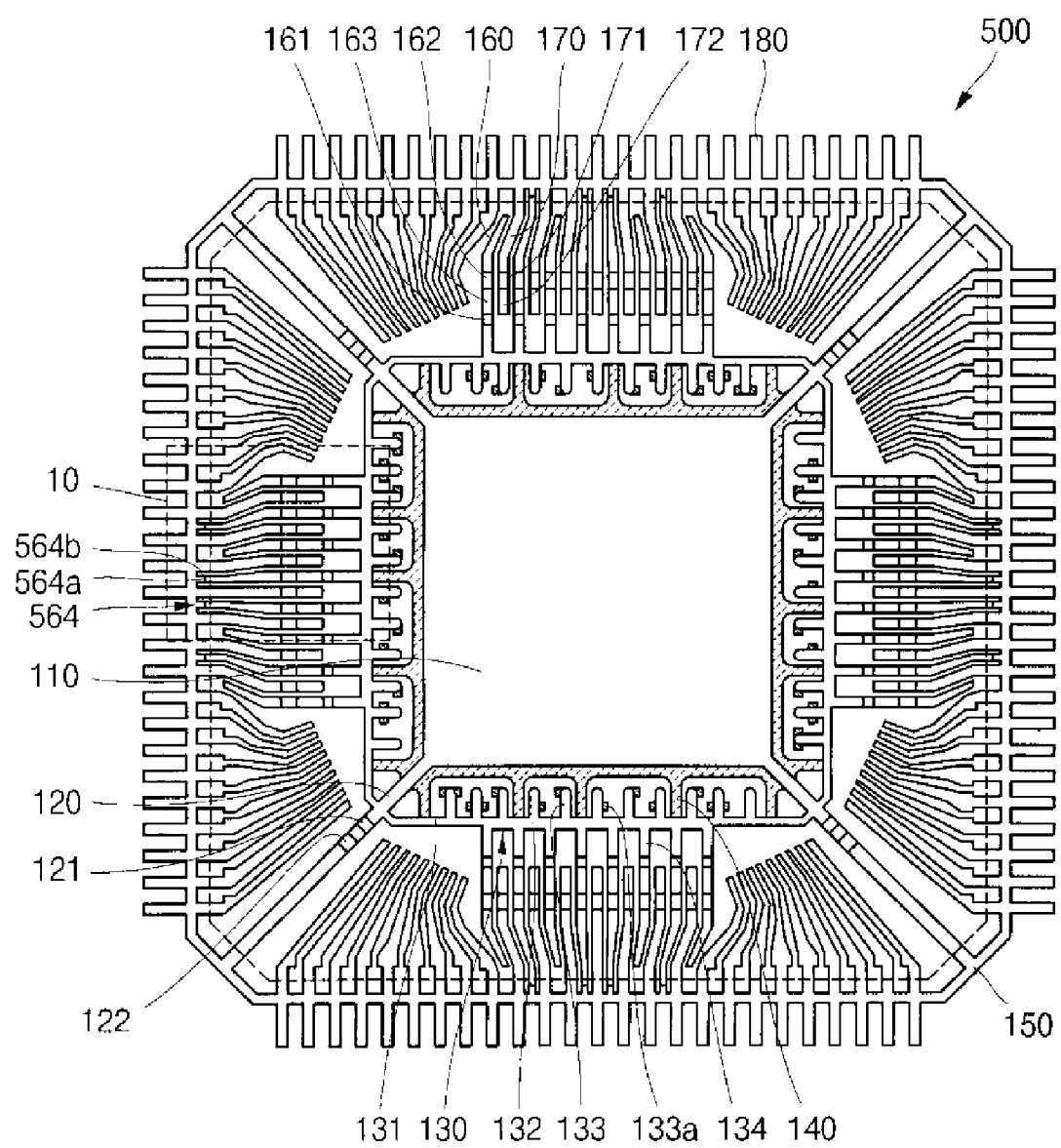
FIG. 9 is a top plan view of an unsingulated leadframe which is integrated into a semiconductor package constructed in accordance with a fifth embodiment of the present invention.
Figure 10:
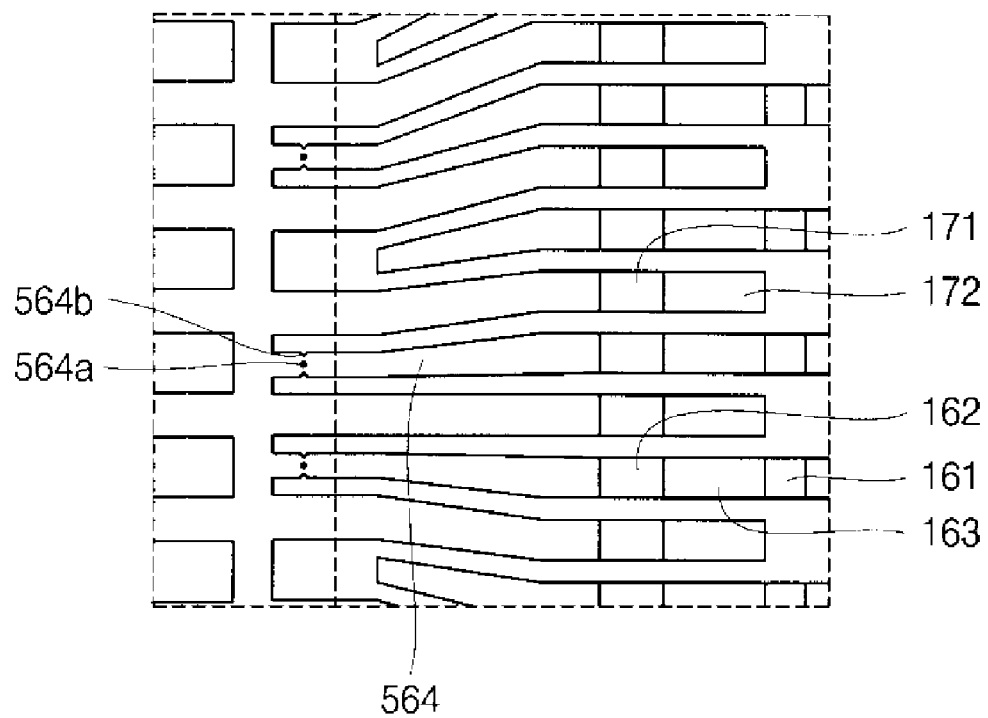
FIG. 10 is an enlargement of the region 10 included in FIG. 9.

Referring now to FIGS. 9 and 10, there is shown a leadframe 500 constructed in accordance with a fifth embodiment of the present invention. The leadframe 500 is also substantially similar in structure to the leadframe 100, with only the distinctions between the leadframes 100, 500 being described below.

In the leadframe 500, certain ones of the extension leads 160 are integrally connected to the dambar 150. More particularly, for those extension leads 160 integrally connected to the dambar 150, the third segments of such extension leads 160 include tie bar portions 564 which facilitate the integral connection thereof to the dambar 150. As is best seen in FIG. 10, in the leadframe 500, the tie bar portion 564 of each extension lead 160 including the same includes dimples 564a and/or notches 564b formed therein. The dashed line in FIG. 9 indicates the region of the leadframe 500 which is covered or encapsulated with the encapsulant material in the process of forming a package body for a semiconductor package including the leadframe 500. The dimples 564a and/or notches 564b are formed outside of the package body as is apparent from FIGS. 9 and 10. The dimples 564a, if included in the tie bar portions 564, assist in removing the exposed portions of the tie bar portions 564 when the dambar 150 is removed during the fabrication of the semiconductor package including the leadframe 500. The notches 564b, if included, are formed by cutting both sides of each tie bar portion 564 to a predetermined depth. Like the dimples 564a, the notches 564b (if included) assist in removing the exposed portions of the tie bar portions 164 when the dambar 150 is removed during the fabrication of a semiconductor package including the leadframe 500.

Figure 11:
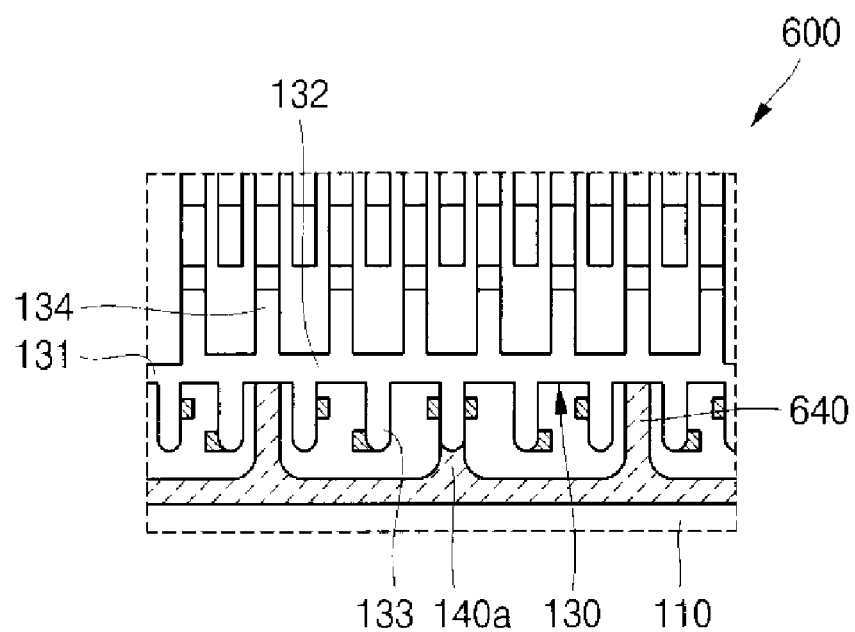
FIG. 11 is a partial top plan view of an unsingulated leadframe which is integrated into a semiconductor package constructed in accordance with a sixth embodiment of the present invention.

Referring now to FIG. 11, there is shown a leadframe 600 constructed in accordance with a sixth embodiment of the present invention. The leadframe 600 is also substantially similar in structure to the leadframe 100, with only the distinctions between the leadframes 100, 600 being described below.

The distinction between the leadframes 100, 600 lies in the structural attributes of the support bars 640 of the leadframe 600 in comparison to the support bars 140 of the leadframe 100. In the leadframe 100, the support bars 140 are segregated into four sets, with each set of the support bars 140 extending generally perpendicularly between a respective one of the peripheral edge segments of the die pad 110 and a corresponding peripheral segment of the land connecting bar 130. Additionally, certain ones of the support bars 140 extend between an adjacent pair of the land leads 133, with certain ones of the support bars 140 extending between a land lead 133 and a respective one of its tie bars 120. In contrast, in the leadframe 600, while certain ones of the support bars 640 extend between an adjacent pair of the land leads 133 and certain ones of the support bars 640 extend between a land lead 133 and a respective one of the tie bars 120, certain ones of the support bars 640 are also integrally connected to respective ones of the land leads 133 and thus linearly aligned therewith. In this regard, when certain ones of the support bars 640 are integrally connected to respective ones of the land leads 133, such support bars 640, by virtue of being electrically connected to the die pad 110, allow for the use of the die pad 110 and the support bars 640 integrally connected to the land leads 133 as common ground electrodes.

Figure 12:
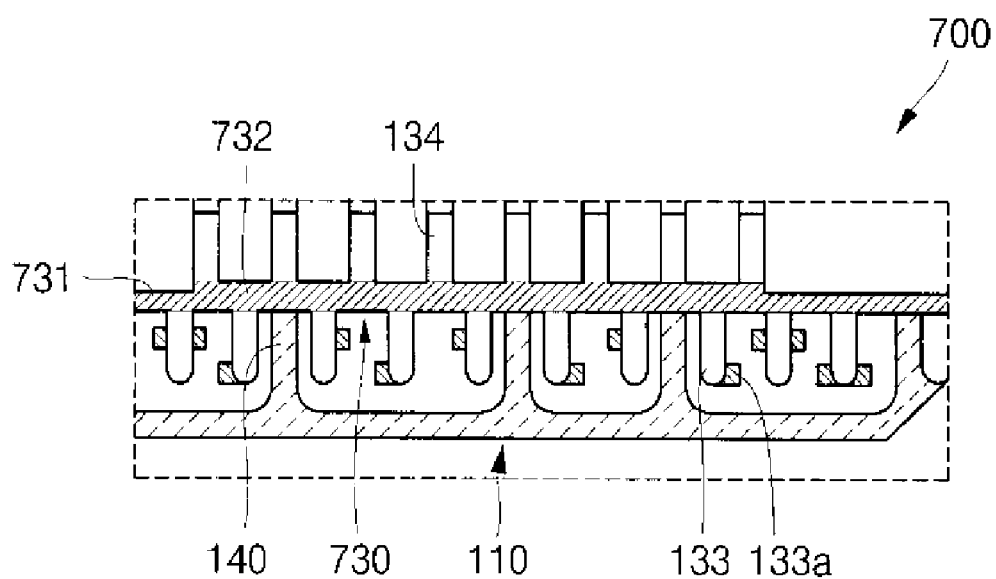
FIG. 12 is a partial top plan view of an unsingulated leadframe which is integrated into a semiconductor package constructed in accordance with a seventh embodiment of the present invention.

Referring now to FIG. 12, there is shown a leadframe 700 constructed in accordance with a seventh embodiment of the present invention. The leadframe 700 is also substantially similar in structure to the leadframe 100, with only the distinctions between the leadframes 100, 700 being described below.

The sole distinction between the leadframes 100, 700 lies in the structural attributes of the land connecting bar 730 of the leadframe 700 in comparison to the land connecting bar 130 of the leadframe 100. More particularly, in the land connecting bar 730, each of the four peripheral segments (including the central portion 732 and the outer portions 731 of each such peripheral segment) are half-etched. Though the entirety of each peripheral segment of the land connecting bar 730 is shown in FIG. 12 as being half-etched, those of ordinary skill in the art will recognize that only the central portion 732 of each peripheral segment of the land connecting bar 730 may be half-etched. The half-etching of each peripheral segment of the land connecting bar 730 as shown in FIG. 12 makes it easier to remove the land connecting bar 730 by sawing with a blade in a subsequent fabrication step for a semiconductor package including the leadframe 700. That is, the half-etching makes the land connecting bar 730 thinner to reduce the friction between the saw blade and the land connecting bar 730 during sawing. As a result, the land connecting bar 730 is easier to remove. As will be recognized, the etching of the land connecting bar 730 occurs on the top surface thereof, the bottom surface being exposed in and substantially flush with the bottom surface of the package body of the semiconductor package including the leadframe 700.

Figure 13:
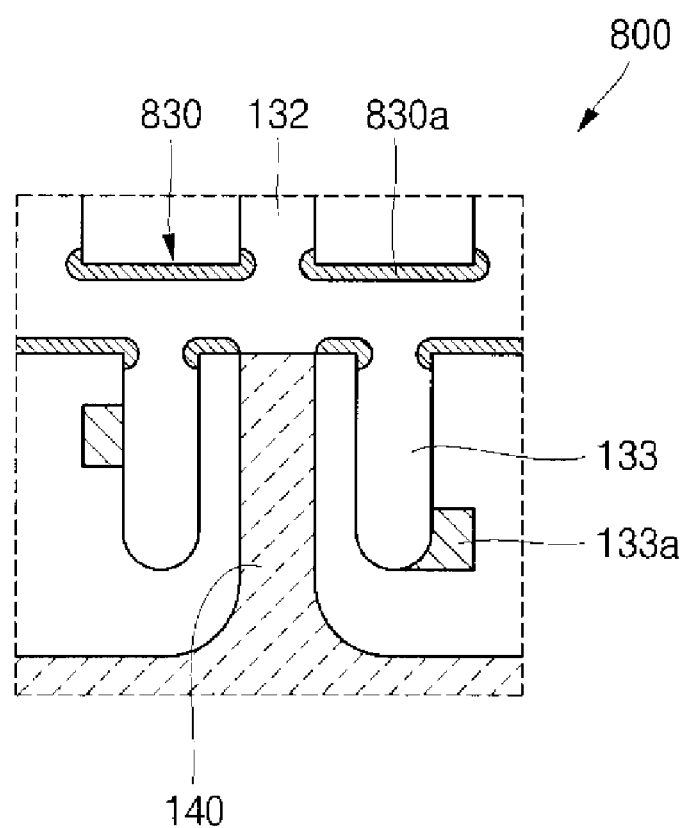
FIG. 13 is a partial top plan view of an unsingulated leadframe which is integrated into a semiconductor package constructed in accordance with an eighth embodiment of the present invention.

Referring now to FIG. 13, there is shown a leadframe 800 constructed in accordance with an eighth embodiment of the present invention. The leadframe 800 is also substantially similar in structure to the leadframe 100, with only the distinctions between the leadframes 100, 800 being described below.

The sole distinction between the leadframes 100, 800 lies in structural attributes of the land connecting bar 830 of the leadframe 800 in comparison to the land connecting bar of the leadframe 100. More particularly, in the land connecting bar 830, each of the four peripheral segments include half-etched portions 830a which are formed at top and/or bottom surface regions of each peripheral segment wherein such peripheral segments interface with or intersect the land leads 133 and the extension leads 160. The inclusion of the half-etched portions 830a makes it easier to remove the land connecting bar 830 using a blade in a subsequent fabrication step of a semiconductor package including the leadframe 800. In addition, the formation of metal burrs as a result of the removal of the land connecting bar 830 is substantially reduced, thus preventing potential shorting between the lands 135, 137.

Figure 14:
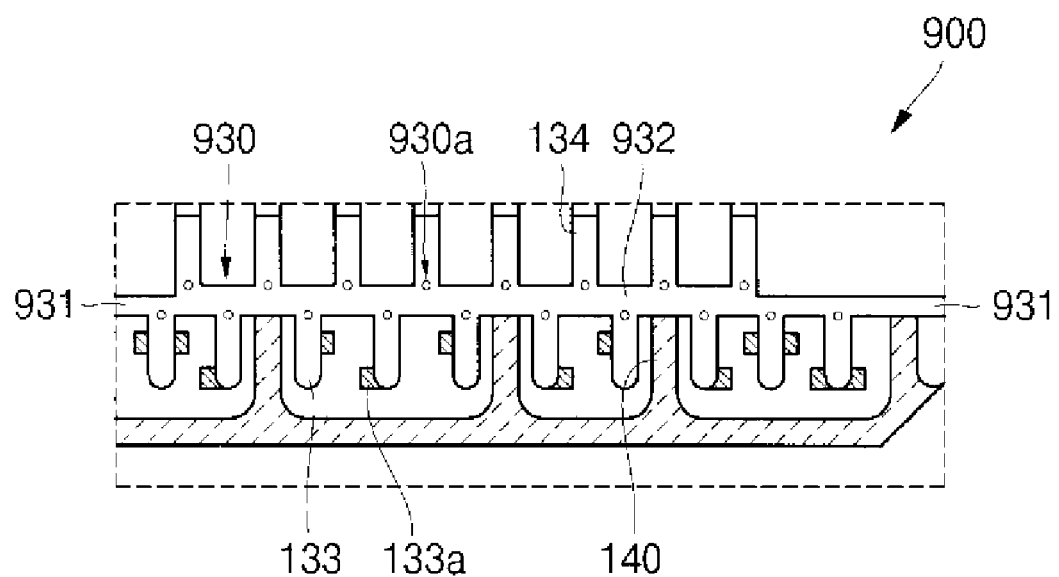
FIG. 14 is a partial top plan view of an unsingulated leadframe which is integrated into a semiconductor package constructed in accordance with a ninth embodiment of the present invention.

Referring now to FIG. 14, there is shown a leadframe 900 constructed in accordance with a ninth embodiment of the present invention. The leadframe 900 is also substantially similar in structure to the leadframe 100, with only the distinctions between the leadframes 100, 900 being described below.

The sole distinction between the leadframes 100, 900 lies in the structural attributes of the land connecting bar 930 of the leadframe 900 in comparison to the land connecting bar of the leadframe 100. More particularly, in the land connecting bar 930, each of the four peripheral segments (including the central portion 932 and outer portions 931 of each such peripheral segment) include a plurality of concave recesses or dimples 930a formed therein. More particularly, the dimples 930a are formed on the top and/or bottom surfaces of the land connecting bar 930 at the points of intersection between the land connecting bar 930 and the land leads 133, and at the points of intersection between the land connecting bar 130 and the extension leads 160 in the manner shown in FIG. 14. With this configuration of the leadframe 900, the dimples 930a can reduce the occurrences of metal burrs during sawing of the land connecting bar 930 in a subsequent fabrication step for a semiconductor package including the leadframe 900. In addition, the frictional heat normally generated between the saw blade and the land connecting bar 930 during sawing can be reduced to increase the sawing rate.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A leadframe for a semiconductor package, comprising:
a generally planar die pad defining multiple peripheral edge segments;
a land connecting bar at least partially circumventing the die pad;
a dambar connected at least partially circumventing the land connecting bar;
a plurality of land leads connected to the land connecting bar and extending inwardly toward the die pad;
a plurality of extension leads connected to the land connecting bar and extending outwardly toward the dambar, each of the extension leads including first and second downsets formed therein in spaced relation to each other so as to define at least first, second and third segments which reside on respective ones of three spaced, generally parallel planes;
a plurality of inner leads connected to the dambar and extending inwardly toward the land connecting bar, at least some of the inner leads including a downset formed therein so as to define at least first and second segments which reside on respective ones of a spaced, generally parallel pair of planes; and
a plurality of outer leads connected to the dambar and extending outwardly therefrom, each of the outer leads being aligned with and integrally connected to a respective one of the inner leads;
the second and third segments of the extension leads extending in generally co-planar relation to respective ones of the first and second segments of the inner leads.

2. The leadframe of claim 1 wherein the die pact has a generally quadrangular configuration, and the land, extension, inner and outer leads are segregated into at least four sets which each extend along a respective one of the peripheral edge segments of the die pad.

3. The leadframe of claim 2 wherein the land connecting bar and the dambar each have a generally quadrangular configuration, the land connecting bar being concentrically positioned within the dambar.

4. The leadframe of claim 3 wherein:
the land connecting bar comprises four peripheral segments which extend in spaced, generally parallel relation to respective ones of the peripheral edge segments of the die pad;
each of the peripheral segments of the land connecting bar includes a spaced pair of outer portions which are interconnected by a central portion; and
the outer portions are each of a first width, with the central portion being of a second width which exceeds the first width.

5. The leadframe of claim 4 wherein:
at least two tie bars are connected to and protrude from the die pad;
the land connecting bar and the dambar are each connected to the tie bars;
the outer portions of each peripheral segment of the land connecting bar each include a chamfered portion which is connected to a respective one of the tie bars.

6. The leadframe of claim 4 wherein the first width is in the range of about 85% to about 90% of the second width.

7. The leadframe of claim 4 wherein each peripheral segment of the land connecting bar is half etched.

8. The leadframe of claim 4 wherein the central portion of each peripheral segment of the land connecting bar is half etched.

9. The leadframe of claim 4 wherein the central portion of each peripheral segment of the land connecting bar is partially etched to have a reverse tapered configuration.

10. The lead frame of claim 4 wherein each peripheral segment of the land connecting bar includes a plurality of dimples formed thereon.

11. The leadframe of claim 10 wherein the dimples are disposed at respective points of intersection between the land leads and the land connecting bar, and between the extension leads and the land connecting bar.

12. The leadframe of claim 4 wherein each peripheral segment of the land connecting bar includes a plurality of half-etched portions disposed at respective points of intersection between the land leads and the land connecting bar, and between the extension leads and the land connecting bar.

13. The leadframe of claim 4 wherein the central portion of each peripheral segment of the land connecting bar has a serpentine configuration.

14. The leadframe of claim 3 wherein at least some of the extension leads each include a tie bar portion which is connected to the dambar.

15. The leadframe of claim 14 wherein the tie bar portion of each of the extension leads including a tie bar portion includes at least one dimple and an opposed pair of notches formed therein.

16. The leadframe of claim 1 wherein the land leads of each set thereof are linearly aligned with respective ones of the extension leads of a corresponding set thereof.

17. The leadframe of claim 1 further comprising a plurality a support bars connected to and extending between the die pad and the land connecting bar.

18. The leadframe of claim 17 wherein at least one of the support bars is connected to a respective one of the land leads.

19. A leadframe for a semiconductor package, comprising:
a die pad;
at least two tie bars connected to and protruding from the die pad;
a dambar at least partially circumventing the die pad;
a plurality of land leads disposed between the dambar and the die pad;
a plurality of extension leads disposed between the dambar and the die pad;
means for connecting the land leads to the extension leads;
a plurality of inner leads connected to the dambar and extending inwardly toward the die pad; and
a plurality of outer leads connected to the dambar and extending outwardly therefrom, each of the outer leads being aligned with and integrally connected to a respective one of the inner leads;
each of the extension leads being bent so as to define at least two segments which reside on respective ones of a spaced, generally parallel pair of planes.

20. A leadframe for a semiconductor package comprising:
a generally planar die pad;
a land connecting bar at least partially circumventing the die pad;
at least two support bars connected to and extending between the die pad and the land connecting bar;
a dambar at least partially circumventing the land connecting bar;
a plurality of land leads connected to the land connecting bar and extending inwardly toward the die pad;
a plurality of extension leads connected to the land connecting bar and extending outwardly toward the dambar, each of the extension leads including first and second downsets formed therein in spaced relation to each other so as to define at least first, second and third segments which reside on respective ones of three spaced, generally parallel planes;
a plurality of inner leads connected to the dambar and extending inwardly toward the land connecting bar, at least some of the inner leads including a downset formed therein so as to define at least first and second segments which reside on respective ones of a spaced, generally parallel pair of planes; and
a plurality of outer leads connected to the dambar and extending outwardly therefrom, each of the outer leads being aligned with and integrally connected to a respective one of the inner leads;
the second and third segments of the extension leads extending in generally co-planar relation to respective ones of the first and second segments of the inner leads.

* * * * *